US012376388B2

(12) United States Patent
Koehler et al.

(10) Patent No.: US 12,376,388 B2
(45) Date of Patent: Jul. 29, 2025

(54) LOW RESISTANCE PHOTOCONDUCTIVE SEMICONDUCTOR SWITCH (PCSS)

(71) Applicant: The Government of the United States of America, as represented by the Secretary of the Navy, Arlington, VA (US)

(72) Inventors: Andrew D. Koehler, Alexandria, VA (US); Travis J. Anderson, Alexandria, VA (US); Geoffrey M. Foster, Woodbridge, VA (US); Karl D. Hobart, Alexandria, VA (US); Francis J. Kub, Arnold, MD (US); Michael A. Mastro, Fairfax, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 193 days.

(21) Appl. No.: 18/463,540

(22) Filed: Sep. 8, 2023

(65) Prior Publication Data
US 2024/0097064 A1    Mar. 21, 2024

Related U.S. Application Data

(60) Provisional application No. 63/405,018, filed on Sep. 9, 2022.

(51) Int. Cl.
H10F 71/00    (2025.01)
H03K 17/785   (2006.01)
(Continued)

(52) U.S. Cl.
CPC .......... H10F 30/10 (2025.01); H03K 17/785 (2013.01); H10F 30/22 (2025.01);
(Continued)

(58) Field of Classification Search
CPC .................................. H03K 17/785
See application file for complete search history.

(56) References Cited

U.S. PATENT DOCUMENTS 5,804,815 A    9/1998  Loubriel et al.
6,248,992 B1   6/2001  Baca et al.
(Continued)

FOREIGN PATENT DOCUMENTS

JP    2007337579 A    8/2008
KR    20160086894 A   1/2017
(Continued)

OTHER PUBLICATIONS

Chao Liu, "Metal-interconnection-free integration of InGaN/GaN light emitting diodes with AlGaN/GaN high electron mobility transistors", Applied Physics Letters, May 8, 2015, pp. 18110-0 through 188110-4, vol. 106, AIP Publishing, Melville, NY, USA.
(Continued)

Primary Examiner — Matthew L Reames
(74) Attorney, Agent, or Firm — US Naval Research Laboratory; Jorie L. Stroup

(57) ABSTRACT

A light controlled semiconductor switch (LCSS), method of making, and method of using are provided. In embodiments, a vertical LCSS includes: a semiconductor body including a photoactive layer of gallium nitride (GaN) doped with carbon; a first electrode in contact with a first surface of the semiconductor body, the first electrode defining an area through which light energy from at least one light source can impinge on the first surface; and a second electrode in contact with a second surface of the semiconductor body opposed to the first surface, wherein the vertical LCSS is configured to switch from a non-conductive off-state to a conductive on-state when the light energy impinging on the semiconductor body is sufficient to raise electrons within the
(Continued)

photoactive layer into a conduction band of the photoactive layer.

20 Claims, 14 Drawing Sheets

(51) Int. Cl.
    *H10F 30/10*     (2025.01)
    *H10F 30/22*     (2025.01)
    *H10F 77/124*     (2025.01)

(52) U.S. Cl.
    CPC ..... *H10F 71/1276* (2025.01); *H10F 71/1278* (2025.01); *H10F 77/1243* (2025.01); *H10F 77/1246* (2025.01)

(56) References Cited

U.S. PATENT DOCUMENTS

| | | | |
|---|---|---|---|
| 8,125,089 | B2 | 2/2012 | Caporaso |
| 8,563,957 | B2 | 10/2013 | Caporaso |
| 9,142,339 | B2 | 9/2015 | Sampayan |
| 9,595,623 | B1 | 3/2017 | Xie |
| 10,403,780 | B2 | 9/2019 | Jang |
| 11,366,401 | B2 | 6/2022 | Sampayan |
| 11,996,840 | B1 * | 5/2024 | Koehler ............... H03K 17/785 |
| 2002/0176649 | A1 | 11/2002 | Bao et al. |
| 2008/0237630 | A1 | 10/2008 | Barrow |
| 2009/0121265 | A1 | 5/2009 | Abele |
| 2010/0097105 | A1 | 4/2010 | Morita et al. |
| 2013/0056842 | A1 | 3/2013 | Sullivan et al. |
| 2015/0214389 | A1 | 7/2015 | Nunnally |
| 2018/0053872 | A1 | 2/2018 | Jang |
| 2020/0075529 | A1 | 3/2020 | Otsuka et al. |
| 2022/0320360 | A1 | 10/2022 | DeJarld et al. |

FOREIGN PATENT DOCUMENTS

| | | |
|---|---|---|
| WO | 2005024452 A2 | 3/2005 |
| WO | 2019059932 A1 | 3/2019 |

OTHER PUBLICATIONS

Guillermo M. Loubriel, "Photoconductive Semiconductor Switches", IEE Transactions on Plasma Science, Apr. 2, 1997, pp. 123-130, vol. 25, No. 2, IEEE Xplore, https://ieeexplore.ieee.org/Xplore/home.jsp.

Travis J. Anderson, "Process Development for GaN-Based Photoconductive Semiconductor Switches (PCSS)," The Electrochemical Society (ECS) Meeting Abstracts, 2018, vol. MA2018-02.

Andrew D. Koeler, "High Voltage GaN Lateral Photoconductive Semiconductor Switches," ECS Journal of Solid State Science and Technology, Oct. 4, 2017, vol. 6(11), pp. S3099-S3102.

William C. Nunnally, "High-Power Microwave Generation Using Optically Activated Semiconductor Switches," IEE Transactions on Electron Devices, Dec. 1990, vol. 37, No. 12, pp. 2439-2448.

Friederike Zimmermann, "Current Status of Carbon-Related Defect Luminescence in GaN," Physics Status Solidi A, Aug. 24, 2021, vol. 218, 211235 (pp. 1-11), published by Wiley-VCH GmbH.

Korean Intellectual Property Office, International Search Report and Written Opinion of the International Search Authority, Dec. 29, 2023, International Application No. PCT/US2023/073716.

Korean Intellectual Property Office, International Search Report and Written Opinion of the International Search Authority, Feb. 15, 2024, International Application No. PCT/US2023/073721.

* cited by examiner

LOW RESISTANCE PHOTOCONDUCTIVE SEMICONDUCTOR SWITCH (PCSS)

CROSS-REFERENCE TO RELATED APPLICATIONS

This application is Nonprovisional of, and claims the benefit of priority under 35 U.S.C. § 119 based on, U.S. Provisional Patent Application No. 63/405,018 filed Sep. 9, 2022. The Provisional application and all references cited herein are hereby incorporated by reference into the present disclosure in their entirety.

FEDERALLY SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case No. 211221-US2.

BACKGROUND OF THE INVENTION

Aspects of the present invention relate generally to semiconductor switches and, more particularly, to light controlled semiconductor switches (LCSS).

Light controlled semiconductor switches (LCSS) are opto-electrical devices made of semiconductor material that conduct electricity when they are turned on with light through optical excitation. In general, when photon energy is sufficient to excite electrons into the conduction band of the LCSS semiconductor material, free electrons are generated in the semiconductor conduction band and electrical current flows through the LCSS. LCSSs have been fabricated from silicon (Si), gallium arsenide (GaAs), silicon carbide (SiC), and gallium nitride (GaN) for Radio Frequency (RF) generation applications, for example. Light controlled switches have been fabricated from semi-insulating silicon carbide for power switching application. In one example, a silicon carbide light controlled switch for power switching applications uses vanadium as an extrinsic dopant to make semi-insulating silicon carbide and sub bandgap illumination. The resistance of a light controlled switch for power switch applications is related to the photoresponsivity to photogenerate carriers in the conduction band and the minority carrier lifetime. The photoresponsivity is reduced for silicon carbide because silicon carbide is an indirect bandgap semiconductor and sub bandgap illumination is used. The minority carrier lifetime in vanadium doped silicon carbide is less than 20 nanoseconds (ns) and reduces the density of free electron carriers in the conduction band. The resistance of the vanadium doped silicon carbide light controlled switch is not reported.

SUMMARY OF THE INVENTION

In a first aspect of the invention, a vertical light controlled semiconductor switch (LCSS) comprises: a semiconductor body including a photoactive layer of gallium nitride (GaN) doped with carbon; a first electrode in contact with a first surface (e.g., top surface) of the semiconductor body, the first electrode defining an area through which light energy from at least one light source can impinge on the first surface; and a second electrode in contact with a second surface (e.g., bottom surface) of the semiconductor body opposed to the first surface, wherein the LCSS is configured to switch from a non-conductive off-state to a conductive on-state when the light energy impinging on the semiconductor body is sufficient to excite electrons into the conduction band of the semiconductor body photoactive layer.

In another aspect of the invention, a lateral light controlled semiconductor switch (LCSS) comprises: a semiconductor body including a photoactive layer of gallium nitride (GaN) doped with carbon; a first electrode in contact with a first surface (e.g., top surface) of the semiconductor body; and a second electrode in contact with the first surface of the semiconductor body, the first and second electrodes defining an area through which light energy from at least one light source can impinge on the first surface, wherein the LCSS is configured to switch from a non-conductive off-state to a conductive on-state when the light energy impinging on the semiconductor body is sufficient to excite electrons into the conduction band of the semiconductor body photoactive layer.

In embodiments, the semiconductor body includes a substrate selected from the group consisting of direct bandgap GaN, effective direct bandgap gallium oxide ($Ga_2O_3$), and indirect bandgap silicon carbide (SiC). The term direct bandgap as used herein refers to a material where a top of the valance band and the bottom of the conduction band occur at the same value of momentum. The term effective direct bandgap as used herein means that the semiconductor indirect bandgap is less than 0.25 eV narrower than the semiconductor direct bandgap. Beta gallium oxide has a narrowest bandgap of 4.73 eV with a direct bandgap of 4.78 eV. Alpha gallium oxide has a narrowest bandgap of 5.29 eV and a direct bandgap of 5.52 eV. In implementation, the LCSS has a resistivity less than 850 ohm-millimeters ($\Omega$*mm) and a sheet resistance of less than 3500 ohms per square. The term sheet resistance refers to the resistance of a square piece of a thin material with contacts made to two opposite sides of the square. In implementations, the LCSS has a specific resistance in the on-state of less than 0.02 milliohm-centimeter (m$\Omega$-cm) for a blocking voltage of 100 volts (V), less than 0.2 mohm-centimeters squared (m$\Omega$-cm$^2$) for a blocking voltage of 1,000 V, and less than 20 m$\Omega$-cm$^2$ for a blocking voltage of 10,000 V. In implementations, for power switching applications, the resistance of the LCSS is less than 0.2$\Omega$ for 1200 V blocking voltage, less than 0.5$\Omega$ for 3300 V blocking voltage, less than 1$\Omega$ for 6500 V blocking voltage, and less than 1$\Omega$ for 10 kV blocking voltage.

In embodiments, for radio frequency (RF) generation applications, the resistance of the LCSS is less than 4 ohm. In embodiments, the LCSS has a blocking voltage of more than 100 V in the off-state, a blocking voltage of 10 kilovolts (kV) in the off-stage, or a blocking voltage of more than 20 kV in the off-state. In implementation, the LCSS has a rise time, an on-time, and a fall time. The on-time of the LCSS is controlled by the on time of the light source. The LCSS turns on when illuminated by a light source and turns-off when the light source is turned off. In aspects, for power switching applications, the on-time is more than one microsecond ($\mu$s). The on-time can be variable to implement such control approaches as pulse width modulations. In embodiments, for RF generation applications, the light source on-time is more than 100 picoseconds (ps).

In aspects, for a vertical LCSS, the area comprises at least a portion of the first electrode, and the first electrode has an open area that is transparent to the light energy. In implementations, the area through which light energy from at least one light source can impinge on the first surface comprises an opening defined by the first electrode through which the light energy can pass. In embodiments, the semiconductor body is configured such that a third surface (e.g., side surface) of the semiconductor body is exposed to light from one or more other light sources. In aspects, carbon is present within the photoactive layer at a dopant concentration of less than $10^{18}$ per cubic centimeter ($cm^{-3}$). In implementations, the photoactive layer has a thickness in the range of 2 microns (µm) to 100 µm, throughout which free excess electron carriers are generated in the conduction band in the on-state. In some embodiments, the photoactive layer can be an epitaxial layer or within an epitaxial layer. In some embodiments, the photoactive layer can be within a bulk substrate. Above bandgap light is strongly absorbed in direct bandgap semiconductor and illumination with sub bandgap light is used for photoactive layer thicknesses more than 2 µm thick to in order to achieve free excess electron carrier concentration throughout the photoactive layer. Either above bandgap light or sub bandgap light can be used for photoactive layer less than 2 µm. In implementations, the semiconductor body is a direct bandgap material. In embodiments, two or more extrinsic dopants are within the photoactive layer.

In aspects, for a lateral LCSS, the area through which light energy from at least one light source can impinge on the first surface comprises an open area between the first and second electrodes that is transparent to the light energy. In embodiments, the semiconductor body is configured such that a first surface (e.g., top surface) of the semiconductor body is exposed to light from one or more light sources and a third surface (e.g., side surface) of the semiconductor body is optionally exposed to light from one or more other light sources. In aspects, carbon is present within the photoactive layer at a dopant concentration of less than $10^{18}$ per cubic centimeter ($cm^{-3}$). In implementations, the photoactive layer has a thickness in the range of 0.2 microns (µm) to 100 µm within which free excess electron carriers are generated in the conduction band in the on-state. In implementations, a lateral light controlled switch does not require that the entire photoactive layer be illuminated with light because the first and second electrodes are on a first surface and the current transports between the first and second electrode. Above bandgap light is strongly absorbed in a direct bandgap semiconductor. Either above bandgap light or sub bandgap light can be used for illumination of a lateral LCSS in accordance with embodiments of the invention. In implementations, the semiconductor body is a direct bandgap material. In embodiments, two or more extrinsic dopants are within the photoactive layer.

In another aspect of the invention, a method of using a vertical light controlled semiconductor switch (LCSS) is provided. The vertical LCSS includes a semiconductor body having a photoactive layer of gallium nitride (GaN) doped with carbon and a substrate layer, a first electrode in contact with a first surface (e.g., top surface) of the semiconductor body, and a second electrode in contact with a second surface (e.g., bottom surface) of the semiconductor body opposed to the first surface. The method includes: applying a voltage to the first and second electrodes to generate an electric field within the semiconductor body; and applying light energy from a light source to at least the first surface of the semiconductor body, wherein the light energy is sufficient to excite electrons into a conduction band of the semiconductor body photoactive layer, thereby switching the LCSS from a non-conductive off-state to a conductive on-state.

In another aspect of the invention, a method of using a lateral light controlled semiconductor switch (LCSS) is provided. The lateral LCSS includes a semiconductor body having a photoactive layer of gallium nitride (GaN) doped with carbon and a substrate layer, a first electrode in contact with a first surface (e.g., top surface) of the semiconductor body; and a second electrode in contact with the first surface of the semiconductor body. The method includes: applying a voltage to the first and second electrodes to generate an electric field within the semiconductor body; and applying light energy from a light source to at least the first surface of the semiconductor body, wherein the light energy is sufficient to excite electrons into the conduction band of the semiconductor body photoactive layer, thereby switching the LCSS from a non-conductive off-state to a conductive on-state.

In implementations, the on-time is more than one microsecond (µs). In implementations, the LCSS has a resistivity in the on-state of less than 750 ohm-mm. In embodiments, the LCSS has a sheet resistance in the on-state of less than 3500 ohms per square. In aspects of the invention, the substrate layer is selected from the group consisting of: GaN, gallium oxide, and silicon carbide (SiC). In implementations, the LCSS has a specific resistance in the on-state of less than 20 mΩ-cm². In aspects of the invention, the LCSS has a blocking voltage in the range of 100 V to 10 kV in the off-state. In embodiments, at least one of the first and second electrodes is transparent to the light energy. In implementations, at least one of the first electrode and second electrodes defines an opening through which the light energy impinges on the first surface of the semiconductor body. In aspects of the invention, applying the light energy comprises applying the light energy from at least one additional light source to a third surface (e.g., side surface) of the semiconductor body. In embodiments, the carbon is present within the photoactive layer at a dopant concentration of $10^{17}$ per cubic centimeter ($cm^{-3}$). In implementations, the photoactive layer has a thickness in the range of 0.5 µm to 100 µm.

In another aspect of the invention, a method of making a vertical light controlled semiconductor switch (LCSS) includes: depositing a photoactive layer of gallium nitride (GaN) doped with carbon on a crystalline substrate to form a semiconductor body; depositing a first electrode in contact with a first surface (e.g., top surface) of the semiconductor body, the first electrode defining an area through which light energy from at least one light source can impinge on the first surface; and depositing a second electrode in contact with a second surface (e.g., bottom surface) of the crystalline substrate opposed to the first surface, wherein the vertical LCSS is configured to switch from a non-conductive off-state to a conductive on-state when light energy impinging on the semiconductor body is sufficient to excite electrons into the conduction band of the semiconductor body photoactive layer.

In another aspect of the invention, a method of making a lateral light controlled semiconductor switch (LCSS) includes: depositing a photoactive layer of gallium nitride (GaN) doped with carbon on a crystalline substrate to form a semiconductor body; and depositing first and second electrodes in ohmic contact with a first surface (e.g., top surface) of the semiconductor body, the first and second electrodes defining an area through which light energy from at least one light source can impinge on the first surface, wherein the lateral LCSS is configured to switch from a non-conductive off-state to a conductive on-state when light energy impinging on the semiconductor body is sufficient to excite electrons into the conduction band of the semiconductor body photoactive layer.

In implementations, depositing the photoactive layer of GaN doped with carbon on the crystalline substrate to form the semiconductor body comprises a metal-organic chemical vapor deposition (MOCVD) of GaN doped with carbon on the crystalline substrate selected from the group consisting of: silicon carbide (SiC), gallium oxide, and gallium nitride (GaN) and gallium oxide (Ga2O3).

BRIEF DESCRIPTION OF THE DRAWINGS

Aspects of the present invention are described in the detailed description which follows, in reference to the noted plurality of drawings by way of non-limiting examples of exemplary embodiments of the present invention.

DETAILED DESCRIPTION

Aspects of the present invention relate generally to semiconductor switches and, more particularly, to light controlled semiconductor switches (LCSS). In embodiments, a gallium nitride (GaN) LCSS is provided having a modulated conductivity that has low resistance in an on-state and high resistance with low leakage current in an off-state. Implementations of the LCSS can operate with high voltage blocking in the off-state. Voltage blocking refers to the ability of a semiconductor device to prevent the flow of current in one direction.

In implementations, a LCSS contains traps that have energies within the semiconductor material bandgap. In general, traps may be formed in a semiconductor material by adding one or more dopants (extrinsic dopant(s)) or by exposing the semiconductor to radiation. In implementations, semiconductor traps in the LCSS can operate to compensate (annihilate) or reduce the concentration of free excess carriers from a conduction or free excess holes in the valance band to produce a high resistivity in the semiconductor material when the semiconductor material is not illuminated by light (i.e., in an off-state). The traps can be photoactive to produce free excess electrons in the conduction band or free excess holes in the valance band when illuminated with photons (i.e., in the on-state). In implementations, light with sufficient energy excites electrons from the trap energy level to the semiconductor conduction band and produces free electron carriers in the conduction band or holes in the valance band.

In embodiments, a low resistance LCSS is provided which has high photoresponsivity. In implementations, the high photoresponsivity of a direct bandgap GaN doped with carbon (GaN:C) (GaN:C) LCSS enables a less than 20 mΩ-cm$^2$ on-state specific resistivity and a 10 kilovolt (kV) blocking voltage in the off-state. In embodiments of the invention, the conductivity of the LCSS has a monotonic increasing relationship to an applied optical power level, and in some cases, has an approximately linear relationship to the optical power level.

Figure 1:
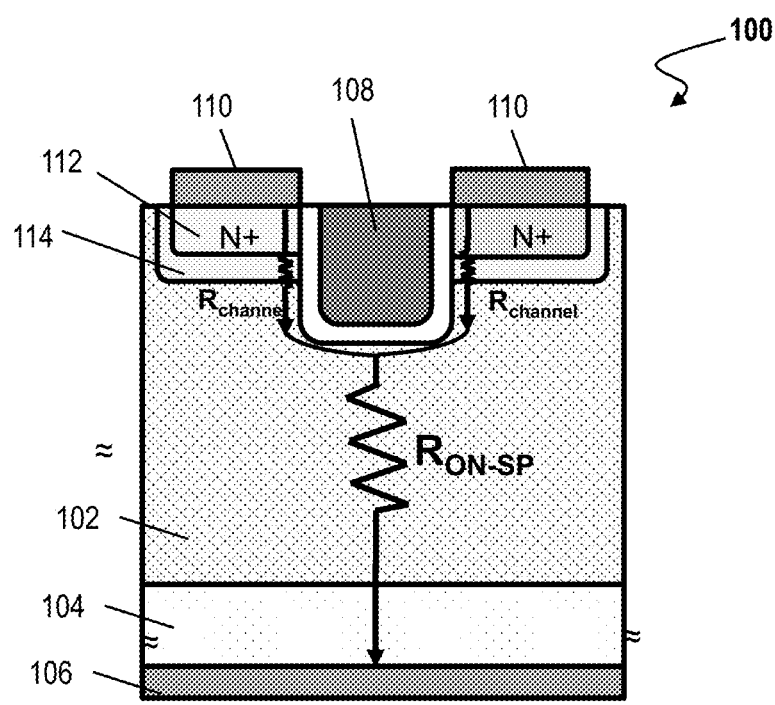
FIG. 1 illustrates a cross-sectional side view of an existing electrically controlled high voltage trench Metal Oxide Semiconductor Field Effect Transistor (MOSFET).

FIG. 1 illustrates a cross-sectional side view of an existing electrically controlled high voltage trench Metal Oxide Semiconductor Field Effect Transistor (MOSFET) 100. The MOSFET 100 includes a drift layer 102 formed on a substrate 104 in contact with a drain 106. An electrical gate 108 is formed between a source 110, spanning an n-type channel layer 112 and a depletion region 114. Conventional electrically controlled power semiconductor device switches such as the MOSFET 100 of FIG. 1 are fundamentally constrained by the un-modulated resistivity of a drift layer (e.g., drift layer 102), which is required for voltage hold-off. Voltage hold-off or breakdown refers to a minimum voltage of an insulator that causes a portion of the insulator to experience electrical breakdown and become electrically conductive. Due to the presence of the resistivity of the drift layer in a conduction path, there is an inherent tradeoff between specific on-state resistance (R$_{ON-SP}$) and breakdown voltage (V$_{BR}$), which is represented by the equation EQ1.

$$R_{ON-SP} \propto V_{BR}^2/(\mu \varepsilon E_C^3), \qquad \text{EQ1:}$$

wherein where μ, ε, and E$_C$ are mobility, permittivity, and critical field.

In order to achieve a higher voltage operation, doping of the drift layer (e.g., drift layer 102) must be reduced and/or the drift layer thickness must be increased, thereby increasing the R$_{ON-SP}$. This relationship is illustrated by a constant slope of V$_{BR}$ versus R$_{ON-SP}$ in a log-log plot for a particular semiconductor material. One possible avenue for technological improvements to conventional unipolar power devices is to pursue wide bandgap and ultra wide bandgap material systems such as gallium oxide (Ga$_2$O$_3$), aluminum nitride (AlN), cubic boron nitride (c-BN), or diamond, which all have relatively higher bandgaps than other semiconductor materials. The term bandgap as used herein refers to an energy range in a solid where no electronic states exist. However, such perspective emerging material systems have large technological challenges in forming high performance unipolar power devices that approach relevant theoretical figures of merit (FOM). FOMs are widely-used to compare power semiconductor materials and devices (e.g., a product of the drain-source on resistance and the gate charge).

In an electrically controlled conventional MOSFET (e.g., MOSFET 100 of FIG. 1), a low doped drift region provides high-voltage blocking capability that is determined by the doping and thickness of this layer. For increased blocking capability via decreased doping or increased thickness, the tradeoff is an increase in resistance of the drift region when the device is in an on-state. In order to break the tradeoff between the decreased doping/thickness and the increased resistance of the drift region, one approach is to replace the existing material of the semiconductor body with another material having a set of material parameters (mobility, permittivity, and critical field) that increase the denominator of the above equation EQ1, $\varepsilon_s \mu E_c^3$ (referred to as Baliga's figure of merit (BFM) for power devices). The BFM is a measurement of a specific on-resistance of the drift region of a vertical field effect transistor (FET).

A typical design of a MOSFET applies a voltage on a gate terminal to modulate conductivity of a region near the gate terminal, and thus modulate the entire device. An inherent property of a MOSFET semiconductor is that an electric field generated by voltage applied to the gate terminal will only significantly modify the carrier concentration in the semiconductor body within a few tens of nanometers (nm) of the gate terminal. That is, there is no functional bias voltage that can change the conductivity of a vertical drift region that extends tens or hundreds of microns in length away from the gate terminal.

Advantageously, embodiments of the invention provide a LCSS that, when illuminated by a light source, results in photo-generation of carriers in a photoactive layer. In other words, implementations of the invention provide a LCSS that absorbs light energy throughout a thickness of a photoactive layer for a vertical LCSS and throughout or within a photoactive layer for a lateral LCSS, thus generating electron carriers in the conduction band within the photoactive layer. This carrier generation throughout the drift region/photoactive layer decouples the conductivity and breakdown relationship described above with respect to conventional MOSFETs. A simple relation photo-conductive figure of merit is provided by the following equation EQ2.

$$R_{on-sp} = \frac{V_B^2}{(1-r)\tau\varepsilon_s\mu E_c^2 \text{Pabs}}, \quad \text{EQ2}$$

where τ is the lifetime and r is reflection coefficient ([0-1]).

Assuming no reflection (r=0) then this relation reduces to the following equation EQ3.

$$R_{on-sp} = \frac{V_B^2}{\tau\varepsilon_s\mu E_c^2 \text{Pabs}}. \quad \text{EQ3}$$

Gate drivers of power switches (e.g., MOSFETs) are noisy and can cause the power switch to turn on at the wrong time and cause failure of a power switch converter. Upper gate drivers for power switches are typically biased (floated) at high voltage, i.e., up to 10,000 volts (V) or higher. Gate drivers for series-connected power switches can be biased (floated) at high voltages (sometimes using transformers). Advantageously, instead of utilizing conventional electrical gate drivers, embodiments of the invention provide a LCSS that may be turned on and off by one or more light sources, thus eliminating the noise problems associated with conventional electrically-controlled gate drivers. Moreover, embodiments of the invention do not require biasing gate drivers at a high voltage (the light source is at ground).

Implementations of the invention provide a LCSS having a lower resistance in an on-state than conventional power switches (e.g., MOSFETs), which are useful in high-voltage operations because of a lack of gate driver noise and because it is unnecessary to float a gate driver at a high voltage. Moreover, gate driver noise is a major problem for high voltage converters, and may cause conventional electrically controlled silicon carbide (SiC) switches to switch at a slower rate. Implementations of the invention have an improved switching time over conventional electrically controlled SiC switches.

Vertical Light Controlled Switch

Figure 2A:
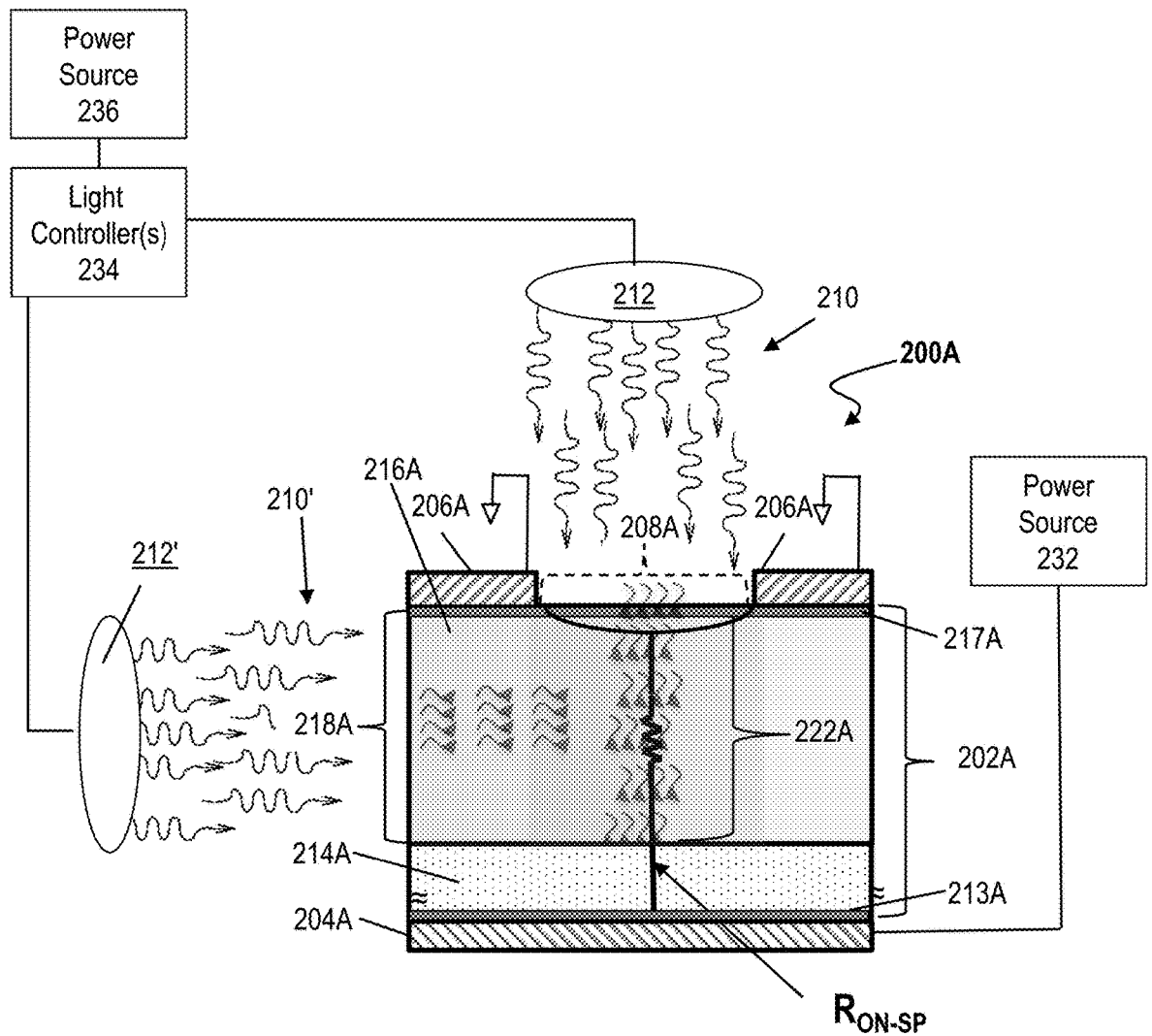
FIG. 2A is a cross-sectional side view of a vertical light controlled semiconductor switch (LCSS) in accordance with embodiments of the invention.

FIG. 2A shows a cross-sectional side view of a vertical light controlled semiconductor switch (LCSS) 200A in accordance with embodiments of the invention. The LCSS 200A includes a semiconductor body 202A between, and in electrical contact with, an anode 204A and a cathode 206A, wherein the cathode 206A is positioned to leave a top surface portion 208A of the semiconductor body 202A exposed to photons 210 from one or more light sources represented at 212. Optical light sources may be one or more of: light emitting diodes (LEDs), fiber optics, lasers, or other light sources. In implementations, the cathode 206A has a shape (e.g., a donut shape) defining an opening through which light from the one or more light sources 212A may impinge on the top surface portion 208A.

In the example of FIG. 2A, the semiconductor body 202A comprises a substrate 214A and a photoactive layer 216A (drift layer) where free excess electron carriers in the conduction band are created. In implementation, the photoactive layer 216A is exposed to photons from one or more light sources 212, from one or more light source 212' or from both sets of one or more light sources 212 and 212'. In implementations, the photoactive layer 216A has a thickness (a thickness of side portion 218A) in the range of 0.5 microns (μm) to 100 μm, throughout which free excess electron carriers in the conduction band are generated in an on-state. In embodiments, the LCSS 200A includes a photoactive layer 216A of GaN doped with carbon (GaN:C), and a GaN substrate (e.g., crystalline substrate) 214A of an N+ doping concentration. In some embodiments, the photoactive layer 216A is an epitaxial layer. The photoactive layer 216A can be an epitaxial layer grown homoepitaxially on substrate 214A of an N+ doping concentration. In some embodiments, the substrate 214 is semi-insulating with a resistivity more than $1\times10^{-5}$ ohm-cm and the photoactive layer 216A is within the substrate 214A.

In embodiments, in order to increase photogeneration of free carriers, a transparent cathode 206A may be utilized to prevent shadowing of the surface portion 208A of the photoactive layer 216A by the cathode 206A. Although not depicted, in such cases, the cathode 206A may extend across an entire length of the semiconductor body 202A. Although photons will create electrons in the conduction band and holes in the valance band, a GaN LCSS 200A according to embodiments of the invention will be dominated by electron transport in the on-state, as the electron mobility is larger than the hole mobility and the electron lifetime is longer than the hole lifetime. Drawing from the electrodes, more electrons will contribute to current flow than holes, therefore the transparent contact can optionally form an ohmic contact to an n-type material. In embodiments, LCSS 200A includes optional N+ doping layers 217A and 213A having ion implanted or epitaxial silicon or germanium dopant, which reduce the contact resistance of ohmic contacts for the cathode electrode 206A and anode contact 204A. The ohmic contacts can be alloyed contacts or non-alloyed contacts known to those skilled in the arts. The cathode electrodes 206A and anode electrode 204A can be Schottky metal contacts. The optional N+ doping layer 217A can improve the uniformity of electron current injected from cathode electrode 206A by distributing the cathode electron current laterally and then vertically. The optional N+ doping layer 213A can be a higher doping concentration in the range of $1 \times 10^{19}$ cm$^{-3}$ to $1 \times 10^{21}$ cm$^{-3}$ doping concentration than substrate 214A and thus reduce the ohmic contact resistance. In general, an ohmic contact is a low resistance junction providing current conduction from a metal to a semiconductor and vice versa. In implementations, the cathode 206A comprises wide bandgap, transparent conductive oxides that allow for an ohmic contact of the cathode 206A and optional N+ doping layer 213A, to the photoactive layer(s) 216A, while still passing the necessary wavelength light there through. In implementations, the anode 204A is a metal anode with thickness in the range of 100 nm to 3000 nm, in order reduce contact resistance further.

Vertical semiconductor switches such as LCSS 200A may offer higher power density than lateral devices. However, designing vertical light-controlled switches pose challenges, such as the ability to grow thick enough semiconductor layers to support desired voltage hold-off while maintaining high quality. In one exemplary embodiment, in order to obtain ~10 kV of hold-off voltage in a GaN substrate (substrate 214A), an approximately 50 μm thick photoactive layer 216A (e.g., GaN:C) is provided, which may be achievable using high growth rate Metal Organic Chemical Vapor Deposition (MOCVD) or Hydride Vapor Phase Epitaxy (HYPE).

Lateral Light Controlled Switch

Figure 2B:
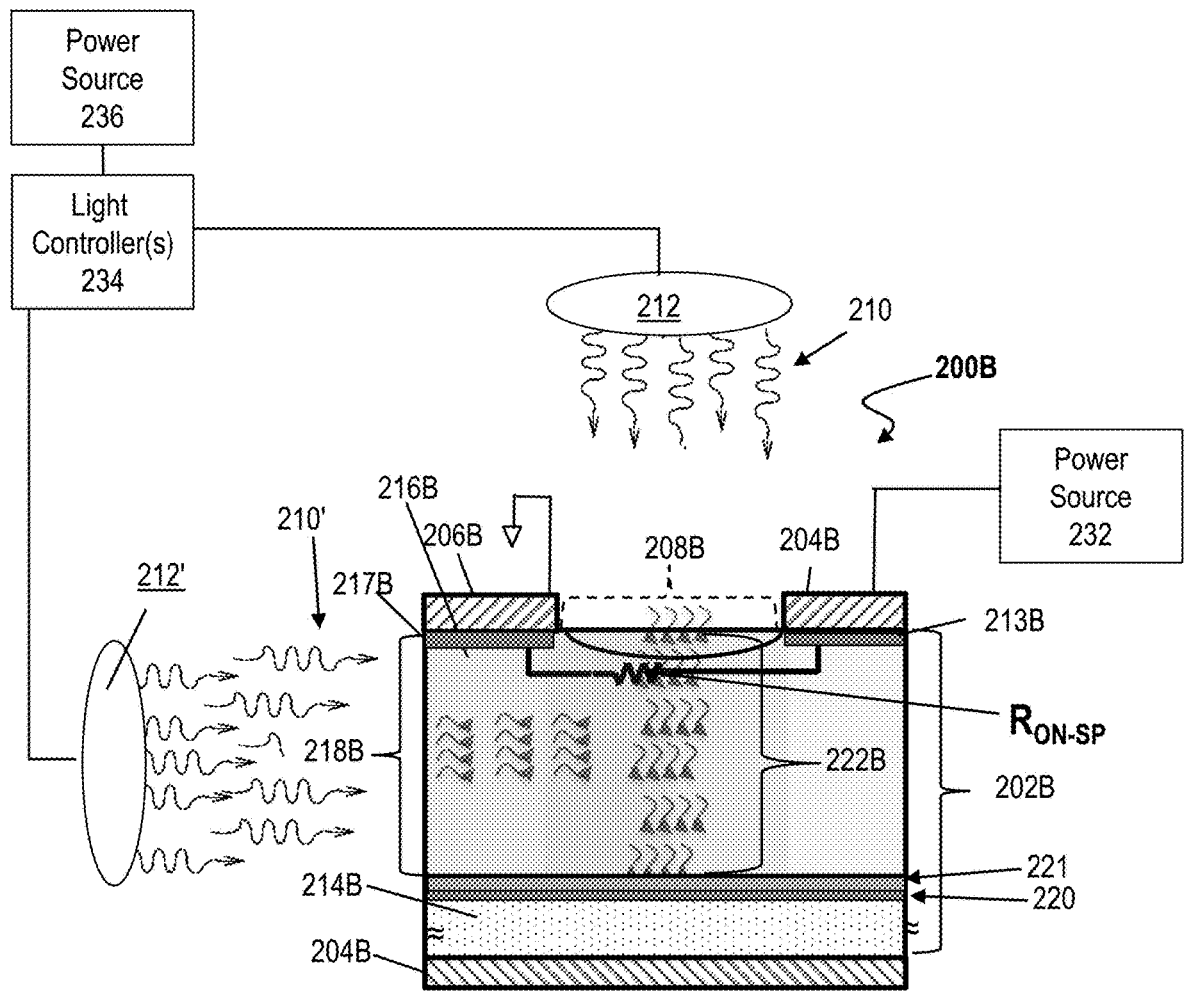
FIG. 2B is a cross-sectional side view of a lateral light controlled semiconductor switch (LCSS) in accordance with embodiments of the invention.

FIG. 2B shows a cross-sectional side view of a lateral light controlled semiconductor switch (LCSS) 200B in accordance with embodiments of the invention. The lateral LCSS 200B includes a semiconductor body 202B in electrical contact with an anode 204B and a cathode 206B, wherein the anode 204B and cathode 206A are positioned to leave a top surface portion 208B of the semiconductor body 202B exposed to photons 210 from one or more light sources represented at 212. In implementations, a power source 232 is a voltage source connected to the anode electrode 204B that has a positive bias relative to grounded cathode electrodes 206B.

In the example of FIG. 2B, the semiconductor body 202B comprises a substrate 214B and a photoactive layer 216B (drift layer) where free excess electron carriers in the conduction band are created. The substrate 214B can be a SiC or GaN substrate, and may be a semi-insulating SiC, a conductive SiC, a semi-insulating GaN, or a conductive GaN. In implementations, the SiC or GaN substrate 214B is semi-insulating. In embodiments, it is necessary to reduce electron leakage current from the cathode 206B to the anode 204B for high anode bias (blocking voltage), such that a semi-insulating SiC or GaN substrate 214B is preferred to reduce the leakage current.

In implementations, the photoactive layer 216B is exposed to photons (210, 210') from one or more light sources represented at 212 and/or 212'. In implementations, the photoactive layer 216B has a thickness (a thickness of side portion 218B) in the range of 0.2 microns (μm) to 100 μm, within which free excess electron carriers in the conduction band are generated in an on-state. In implementations, the photons 210, 210' have wavelengths for above bandgap light that enables valance-band-to-conduction band direct photogeneration. In embodiments, the photons 210, 210' have wavelengths for sub-bandgap light that enables excitation from traps within the bandap to the conduction band or valance band. GaN has a bandgap of 3.4 eV at room temperature, such that wavelengths of light shorter than or equal to 365 nm are above bandgap light and wavelengths of light longer than 365 nm are sub-bandgap light. In implementations, the photons 210' from the one or more light sources 212' have wavelengths for sub-bandgap light which allow photons to transport throughout the photoactive layer 216B. In embodiments, the LCSS 200B includes: a photoactive layer 216B of GaN doped with carbon (GaN:C); two or more extrinsic dopants such as carbon (GaN:C) and iron (GaN:Fe); or carbon (GaN:C) and traps within the bandgap created by radiation, as well as a substrate (e.g., crystalline substrate) 214B comprising a semi-insulating SiC or GaN.

Optionally, cathode 206B may be a reflective cathode 206B comprising a reflective (bottom) surface adjacent the photoactive layer 216B, such that scattered sub bandgap light (e.g., photons 210') within side portion 218B (e.g., from the one or more light sources 212') can reflect off the reflective (bottom) surface of the cathode 206B to remain within the photoactive layer 216B. In implementations, the reflective cathode 206B is floating, grounded or biased. In implementations, a negative bias on the reflective cathode 206B directs photogenerated electrons toward the top surface portion 208B and the anode 204B.

In some implementations utilizing a GaN:C photoactive layer 216B and a SiC substrate 214B, a thick (200 nm-5 μm) epitaxial layer of GaN:C (photoactive layer 216B) is grown on a SiC substrate (substrate 214B) heteroepitaxially with high quality utilizing a nucleation layer 220 (e.g., AlN), such as by a metal-organic chemical vapor deposition (MOCVD) of the GaN:C layer or by Hydride Vapor Phase Epitaxy (HVPE). In the case of a GaN:C photoactive layer 216B and a SiC substrate 214B, the coefficient of thermal expansion difference of GaN:C and SiC limit how thick the GaN:C layer can be grown without cracking. Thicker layers of GaN:C can be grown on SiC for approaches such as laser assisted Metal Organic Chemical Vapor Deposition (MOCVD) growth that enable GaN:C epitaxial growth at a temperature less than 1000 C.

In implementations, a thick (200 nm-100 μm) epitaxial layer of GaN:C (photoactive layer 216B) is grown on a GaN substrate (substrate 214B) homoepitaxially, such as by a metal-organic chemical vapor deposition (MOCVD) of the GaN:C layer. The nucleation layer 220 is optional for the homoepitaxial growth of GaN on GaN such as by MOCVD or HVPE. In implementations, the growth of a GaN:C layer on a bulk GaN substrate provides a reduction in dislocation density, extremely low unintentional doped carrier concentration, and less point defects. FIG. 2B illustrates a photoactive layer 216B having a thickness 222B.

In implementations, a photoactive layer 216B is within a free standing GaN substrate 214B. The free standing GaN substrate 214B can be GaN doped with carbon (GaN:C). Optionally the substrate 214B includes two or more extrinsic dopants such as carbon (GaN:C) and iron (GaN:Fe), or carbon (GaN:C) and traps within the bandgap created by radiation to enable a GaN substrate 214B that is both photoactive and semi-insulating with a resistivity greater than $1\times10^5$ Ω-cm. In embodiments, a free standing GaN substrate 214B can be grown by Hydride Vapor Phase Epitaxy or ammonthermo growth.

In the case of a GaN:C photoactive layer 216B and a GaN substrate 214B, a low resistance, high blocking voltage lateral LCSS 200B may be generated by epitaxially growing a semiconductor layer of GaN:C on a semi-insulating substrate having a resistance more than $1\times10^5$ Ω-cm. In implementation, the anode 204B and cathode 206B electrodes are formed on the top surface of the photoactive layer for lateral light controlled switch (top-to-top electrodes). The advantage of a light controlled switch that uses GaN:C homoepitaxial growth on a GaN substrate is that there is not a thermal coefficient of expansion limitation on how thick the GaN:C epitaxial layer can be grown, and in the case that a semi-insulating GaN substrate 214B is used, there is not a leakage path from the anode 204B to the cathode 206B through the substrate 214B. In implementations, the GaN:C epitaxial layer (photoactive layer 216B) is doped with carbon at a concentration of approximately $1\times10^{17}$ cm$^{-3}$ to $1\times10^{18}$ cm$^{-3}$, to provide a high blocking voltage and high photogeneration.

In implementations, passivation of the surface of the semiconductor body 202B (i.e., coating the material to become "passive") may be utilized to achieve a high blocking voltage in the LCSS 200B. Passivation dielectrics that may be utilized in accordance with embodiments of the invention include: silicon oxide (SiO or SiO2), silicon nitride (SiN), or AlN. In implementations, a dielectric material is deposited on a surface of the semiconductor body 202B using plasmas with low energy ions to minimize defect creation within the surface region of the semiconductor material. In embodiments, the plasma ion energy is less than 100 electron volt (eV) to minimize damage to the surface. An optimized dielectric passivation can achieve an electric field between the anode 204B and cathode 206B of more than 160 volts per centimeter (V/cm) without breakdown, and in an optimized dielectric passivation can achieve 530 V/cm for a GaN LCSS 200B.

In implementations, a semiconductor body substrate 214B can be optimized for thermal conductivity using known approaches such as thinning and incorporating diamond material into the semiconductor body substrate 214B. In implementations, a lateral geometry (top-to-top electrodes) LCSS 200B can be optimized with interdigitated fingers to realize higher current density and reduce die size.

Although photons will create electrons in the conduction band and holes in the valance band, a GaN LCSS 200A according to embodiments of the invention will be dominated by electron transport in the on-state, as the electron mobility is larger than the hole mobility and the electron lifetime is longer than the hole lifetime. Drawing from the electrodes, more electrons will contribute to current flow than holes, therefore the transparent contact can optionally form an ohmic contact to an n-type material. Optional, LCSS 200A includes N+ doping layers 217B and 213B having ion implanted or epitaxial silicon or germanium dopant to reduce the contact resistance of ohmic contacts for the cathode electrode 206B and anode contact 204B. The ohmic contacts can be alloyed contacts or non-alloyed contacts known to those skilled in the arts. The cathode electrodes 206B and anode electrode 204B can be Schottky metal contacts. In general, an ohmic contact is a low resistance junction providing current conduction from a metal to a semiconductor and vice versa. In implementations, the cathode 206B and the anode 204B comprise a metal with a thickness in the range of 100 nm to 3000 nm, in order reduce contact resistance further.

Photogeneration

The generation of excess electrons carriers in the conduction band and excess hole carriers in the valance provides electrical conductivity modulation. As indicated by the conductivity equation EQ3 above, the generation of free excess carriers is related to achieving low on-resistance $R_{ON\text{-}SP}$. Photogeneration in a semiconductor is generally described by the following equation EQ4.

$$G = \eta_0 \frac{P\lambda}{hc} e^{-\alpha y}, \quad \text{EQ4}$$

where G is photogeneration rate, P is the (local) light intensity, go is the internal quantum efficiency (for excess carriers generated per photon absorbed), α is the absorption coefficient.

According to aspects of the invention, light absorption can be within an intrinsic or extrinsic free excess carrier photogeneration region. In implementations, photons 210 and optionally 210' illuminate the photoactive layer 216A to generate free electrons that modify the resistivity of the LCSS and turn the LCSS on, the substrate 214A comprises an N-type semiconductor material with a doping concentration in the range of $1\times10^{18}$ cm$^{-3}$ to $1\times10^{21}$ cm$^{-3}$. In embodiments, the interface between the photoactive layer 216A and the N-type substrate 214A, 214B may be a homojunction or heterojunction, and may be engineered to achieve the desired performance metrics of a LCSS. The term homojunction as used herein refers to a semiconductor interface that occurs between layers of similar semiconductor material; where the materials are the same semiconductor type. The N-type substrate may be a bulk substrate and photoactive layer 216A may be an epitaxial layer. In contrast, the term heterojunction as used herein refers to an interface between two layers or regions of dissimilar semiconductor materials.

According to aspects of the invention, light absorption can be within an intrinsic or extrinsic free excess carrier photogeneration region. In implementations, photons 210 and optionally 210' illuminate the photoactive layer 216B to generate free electrons that modify the resistivity of the LCSS 200B and turn the LCSS 200B on, and the substrate 214B comprises a semi-insulating substrate or a N-type semiconductor material. In embodiments, the interface between the photoactive layer 216B and the substrate 214B may be a homojunction or heterojunction, and may be engineered to achieve the desired performance metrics of a LCSS 200B. The term homojunction as used herein refers to a semiconductor interface that occurs between layers of similar semiconductor material; where the materials are the same semiconductor type. In contrast, the term heterojunction as used herein refers to an interface between two layers or regions of dissimilar semiconductor materials. The N-type substrate may be a bulk substrate and photoactive layer 216B may be an epitaxial layer.

In implementations, the semiconductor body 202A, 202B thickness is engineered in conjunction with illumination wavelength selection to ensure an entire volume of the photoactive layer 216A, 216B can be optically modulated (such that an on-state results in the photo-generation of carriers throughout the photoactive layer 216A, 216B) and the photons/light (210, 210') is not absorbed only at the surface 208A, 208B of the photoactive layer 216A, 216B. In FIG. 2A, for example, vertical illumination wavelength penetration is depicted at 222A.

Gallium nitride (GaN) has a bandgap of 3.4 electron volts (eV) at room temperature. Illumination wavelengths shorter than 365 nm are sub bandgap illumination. Illumination wavelengths longer than 365 nm are above bandgap illumination. Sub bandgap illumination excite electrons from trap levels within the bandgap to the conduction band. Above bandgap illumination excite electrons from the valance band to the conduction band. Gallium oxide has a bandgap of 4.8 eV at room temperature. Illumination wavelength shorter than 258 nm are sub bandgap illumination. Illumination wavelength longer than 258 nm are above bandgap illumination. Sub bandgap illumination excite electrons from trap levels within the bandgap to the conduction band. Above bandgap illumination excite electrons from the valance band to the conduction band. 4H-silicon carbide has a bandgap of 3.26 eV at room temperature. Illumination wavelengths shorter than 380 nm are sub bandgap illumination. Illumination wavelengths longer than 380 nm are above bandgap illumination. Sub bandgap illumination excite electrons from trap levels within the bandgap to the conduction band. Above bandgap illumination excite electrons from the valance band to the conduction band.

The equation for electrical conductivity in a semiconductor as a function of free excess carriers is provided in the following equation EQ5:

$$\sigma = q(\mu_e n + \mu_h p),\qquad \text{EQ5:}$$

where $\mu_e$ and $\mu_h$ are the electron mobility and hole mobility, respectively, and n and p are the electron and hole free excess carrier density.

In some embodiments, light from one or more optical sources (e.g., 212, 212') produces a free excess carrier density in the photoactive layer in the range of $1\times10^{14}$ cm$^{-3}$ to $1\times10^{19}$ cm$^{-3}$.

The mobility of the free excess carriers can be degraded by dislocations and defects in the semiconductor material of the semiconductor body 202. Thus, approaches to reduce the dislocations and defects are desired for LCSSs. In implementations, the semiconductor body 202A, 202B of the LCSS 200A, 200B is built using homoepitaxial growth of an III-N semiconductor layer (photoactive layer 216A, 216B) on an III-nitride substrate (substrate 214A, 214B) to reduce dislocation and defect densities. The homoepitaxial growth of GaN on a best GaN substrate (ammothermal growth substrate) results in defect levels of about $1\times10^3$ cm$^{-2}$ to about $1\times10^5$ cm$^{-2}$. Homoepitaxial growth of GaN on conventional GaN substrates (Hydride Vapor Phase Epitaxy growth) results in a defect density of $1\times10^5$ cm$^{-2}$ to $1\times10^7$ cm$^{-2}$. GaN heteroepitaxial growth on silicon carbide (SiC) results in a defect density of about $1\times10^7$ cm$^{-3}$ to $1\times10^{10}$ cm$^{-3}$.

A high voltage electrically gated unipolar semiconductor switch, such as a SiC MOSFET with a 10 kV blocking voltage, has a drift layer N-type dopant concentration of about $2\times10^{14}$ cm$^3$ and produces about $2\times10^{14}$ cm$^{-3}$ free excess carriers from the ionized N-type dopant. Thus, the optical approach to produce excess free carriers in the conduction bands in the drift layer of a LCSS 200A, 200B in accordance with embodiments of the invention can have significantly larger excess free carrier densities and thus significantly lower on-resistance compared to an electrically gated unipolar semiconductor switch.

The LCSS 200A, 202B may be an intrinsic light-controlled switch or an extrinsic light-controlled switch. An extrinsic light-controlled switch uses traps with energies within the bandgap of the semiconductor body (e.g., 202A, 202B) for switch operation. In general, a trap is any location within a solid (e.g., semiconductor or insulator) that restricts movement of electrons and holes (i.e., equivalent positive electrical charges that result from an absence of an electron within a crystal structure). The traps with energies within the bandgap serve two purposes for extrinsic light-controlled switch. First, the traps act as carrier recombination centers that will annihilate carriers generated by shallow dopants in the semiconductor body that will increase the resistivity of the semiconductor body and, at a sufficiently high level of traps, will make the semiconductor body semi-insulating with resistivity values in excess of about $10^9$ ohms centimeter (ohm-cm) and as high as about $10^{11}$ ohm-cm.

A second purpose for the traps is to operate as photo-generation centers to generate free excess carriers within the conduction band and/or the valance band. Traps with the characteristic to produce excess free carriers in the conduction or valance band when illuminated with photons are photoactive traps. Traps that do not produce excess free carriers in the conductor or valance band when illuminated with photons are non-photoactive traps. Energy loss mechanisms such as phonon generation can make a trap non-photoactive. It has been experimentally demonstrated that carbon dopant in GaN produces a photoactive trap. The traps generated by carbon doping are very photoactive for carbon doping less than about $10^{18}$ cm$^{-3}$ dopant concentration. Carbon traps can be photoactive with carbon doping to about $5\times10^{19}$ cm$^{-3}$ dopant concentration, but the photoactivity may be reduced. Iron dopant in GaN produces traps that are non-photoactive or very weakly photoactive for high concentrations of iron. GaN with carbon doping has four orders-of-magnitude higher photoresponsivity than GaN doped with iron for light wavelengths shorter than 375 nm and more than three orders-of-magnitude higher photoresponsivity than GaN doped with iron for light wavelengths shorter than 370 nm.

In implementations, extrinsic dopants are incorporated within the photoactive layer 216A, 216B of an extrinsic LCSS 200A, 200B to create traps with energies within the bandgap of the photoactive layer (e.g., GaN). In general, traps may be formed in a semiconductor material by adding a one or more dopant(s) (extrinsic dopant(s)) or by exposing the semiconductor to radiation. Dopants that create traps with energies within the bandgap of the semiconductor body material include carbon, carbon-hydrogen complexes, iron, and magnesium-hydrogen complexes. In implementation, there may one extrinsic dopant or there may be two or more extrinsic dopant within the photoactive layer 216A, 216B of an extrinsic LCSS 200A, 200B to create traps with energies within the bandgap of the photoactive layer. In implementation, the photoactive layer may have both carbon and iron extrinsic dopants. Carbon extrinsic dopant in GaN have the characteristic of large photoresponsivity. Iron extrinsic dopants in GaN have the characteristic of fast recombination time. A fast recombination time is desirable to reduce the turn off time of the LCSS when the light turns off. A photoactive layer having both carbon and iron extrinsic dopant can have both high photoresponsivity and reduced turn-off time of the LCSS. The turn on time of the GaN LCSS is more than 50 picoseconds.

In implementation, there may be one or more extrinsic dopants and radiation such as carbon extrinsic dopant and radiation. The radiation may include exposure of the LCSS 200A, 200B with electrons having an energy more than 1 million electron volts (MeV), exposure to neutrons, exposure to protons having energy more than 1 MeV, or ion implantation of hydrogen with energies of less than 200 kilo electron volts (keV), less than 450 kilo electron volts (keV), or less than 2 MeV. Hydrogen ion implantation into the first surface of a vertical LCSS 200A, with less than 200 keV or less than 450 keV hydrogen ions reduces the minority carrier recombination time in the photoactive layer 216A in the region of the cathode electrode and the first surface of the semiconductor body 202A. The reduced minority carrier lifetime reduces the lifetime of holes at the cathode interface with photoactive layer 216A and reduces the influence of stored holes in traps which cause electron injection from the cathode into the photoactive layer 216A as long as the holes are stored at the cathode interface. Reducing the stored time of the holes at the cathode interface can cause persistent photoconductivity and reduce the fall time of the LCSS 200A when illumination is turned off. In implementations, the turn-off time of a GaN LCSS 200A with carbon extrinsic dopant is less than 100 microseconds.

The recombination (annihilation) of excess carriers in the conduction or valance band in a semiconductor body (e.g., 202A, 202B) may take place via different recombination mechanisms. There are three basic recombination mechanisms that are responsible for carrier annihilation in a semiconductor body or compensation of free excess carrier created by shallow donors or acceptors. They are (1) non-radiative recombination at traps with energy levels within the bandgap (i.e., the multiphonon process), (2) band-to-band radiative recombination, and (3) Auger band-to-band recombination.

In implementations, an extrinsic LCSS 200A, 200B can use light with photon energies larger than the bandgap of the photoactive layer 216A, 216B to generate free excess carriers, but can also use light with photon energies less than the bandgap energy of the photoactive layer 216A, 216B to generate free excess carriers. GaN has a bandgap of 3.4 eV at room temperature and wavelengths of light shorter than or equal to 365 nm are above bandgap light and wavelengths of light longer than 365 nm are sub-bandgap light. Photons with a photon energy less than the bandgap of the photoactive layer 216A, 216B can be absorbed by traps at energies within the bandgap of the photoactive layer 216A, 216B, and excite electrons into the conduction band or holes into the valance band. In implementations, the generation of excess electrons carriers or excess hole carriers provides electrical conductivity modulation.

One characteristic of the traps at energies within the bandgap of photoactive layer 216A, 216B that can affect the performance of an extrinsic LCSS 200A, 200B is whether the traps have the characteristic radiative traps or non-radiative traps. Non-radiative traps have the characteristic that the energy is dissipated in the form of phonons rather than photon emission. There is a general corresponding characteristic that traps that are poor for photon generation (nonradiative traps) are also poor for photogeneration of free excess carriers. The characteristic of traps at energies within the bandgap can change depending on the concentration of a dopant generated trap. For example, traps induced by carbon doping in GaN can be radiative for low concentrations of carbon but become non-radiative for high level of carbon doping.

In implementations, an intrinsic LCSS 200A, 200B uses photons with an energy larger than the bandgap of the photoactive layer 216A, 216B to generate free excess carriers. In such cases, light with a photon energy greater than the bandgap of the photoactive layer 216A, 216B will excite electrons from the valence band to the conduction band of the semiconductor body 202A, 202B, generating free excess electron carriers in the conduction band and a corresponding hole carrier in the valance band. The photogeneration of excess electron carriers and excess hole carriers provide electrical conductivity modulation.

In implementations, the LCSS 200A, 200B blocks high voltage in the dark (off-state), turns on with low resistance under illumination (on-state), and switches between the on and off-states quickly. In implementations, the LCSS 200A, 200B has an on-state resistance of: milliohms (mΩ), 10 mΩ, 15 mΩ, 20 mΩ, 50 mΩ, 100 mΩ, 200 mΩ, 500 mΩ, 1000 mΩ, 2000 mΩ, or 5000 mΩ. In some embodiments, the leakage current of the LCSS 200A, 200B in the off-state is: less than $1 \times 10^{11}$ amperes (A), less than $1 \times 10^{-9}$ A, less than $1 \times 10^{-6}$ A, less than $1 \times 10^{-4}$ A, or less than $1 \times 10^{-3}$ A. In embodiments, when utilized for power switching applications, the LCSS 200A, 200B is configured to have a lowest on-resistance compatible with a size and power dissipation of a light source (e.g., 212, 212').

In embodiments, the LCSS 200A, 200B has a blocking voltage in an off-state more than: 100 volts (V), 200 V, 500 V, 1000 V, 1700 V, 3300 V, 4500 V, 6500 V, 10000 V, 20000 V, or 40000 V. In implementations, the LCSS) has an on-resistance of: 5 milliohms (mΩ), 10 mΩ, 15 mΩ, 20 mΩ, 50 mΩ, 100 mΩ, 200 mΩ, 500 mΩ, 1000 mΩ, 2000 mΩ, or 5000 mΩ.

Illumination

As indicated above, the LCSS 200A, 200B may be illuminated with one or more light sources, including an optical fiber that transmits light between the light source (e.g., 212, 212') and the semiconductor body 202A, 202B. In implementations, the one or more light sources transmit light through free space to the semiconductor body 202A, 202B. In other implementations, the one or more light sources transmit light through an optically transparent material such as an optically transparent polymer or optically transparent solid material. In embodiments, the one or more light sources illuminate the semiconductor body 202A, 202B from the top and/or from one or more side portions (e.g., back, front, right side and/or left side 218A, 218B). In implementations, the one or more light sources are configured to produce photons with energies above the bandgap of the photoactive layer 216A, 216B, or produce photons with energies below the bandgap of the photoactive layer 216A, 216B.

In embodiments, the LCSS 200A, 200B is designed to operate in a low injection of photogenerated carriers or high injection of photogenerated carrier (the excess carrier concentration is much greater than the equilibrium density) region of operation. In implementations, the low injection of photogenerated carriers has a free carrier density less than $5 \times 10^{16}$ cm$^{-3}$ and high injection operating for free excess carrier higher than $5 \times 10^{16}$ cm$^{-3}$. In aspects, the carrier mobility is degraded for operation under high injection. In embodiments, the LCSS 200A, 200B can operate in the high injection region of operation; however higher levels of free excess carriers, and thus optical power, will be because the carrier mobility is degraded under high injection condition. Approaches to lower the free excess carrier density for a given optical power level include making the device area larger. To increase the area and thus lower the carrier density for a lateral light-controlled switch 200B, the perimeter of the anode and cathode can be increased. In embodiments, the LCSS 200B is implemented in an interdigitated design of the anode and cathode electrodes. In general, a lateral light-controlled switch (e.g., LCSS 200B) is designed with a preferred separation between the anode and cathode electrodes in an interdigitated design. In aspects of the invention, if the process uses multiple levels of metal with contact between the metal levels, other design arrangements for the anode and cathode electrodes other than interdigitated designs are possible.

In embodiments, the LCSS 200A, 200B is configured to be illuminated by one or more light sources (e.g., 112, 112') having a light output of: 1 milliwatt (mW), 50 mW, 100 mW, 200 mW, 500 mW, 1000 mW, 2000 mW, 5000 mW, or 10000 mW. In power switching applications, the LCSS 200A, 200B may be configured to have a lowest on-resistance that is compatible with the size and power dissipation of the one or more light source. For radio frequency and microwave applications, the LCSS 200A, 200B may be configured to have a low on-resistance compared to the resistance of a 50 ohm transmission line.

Figure 3:
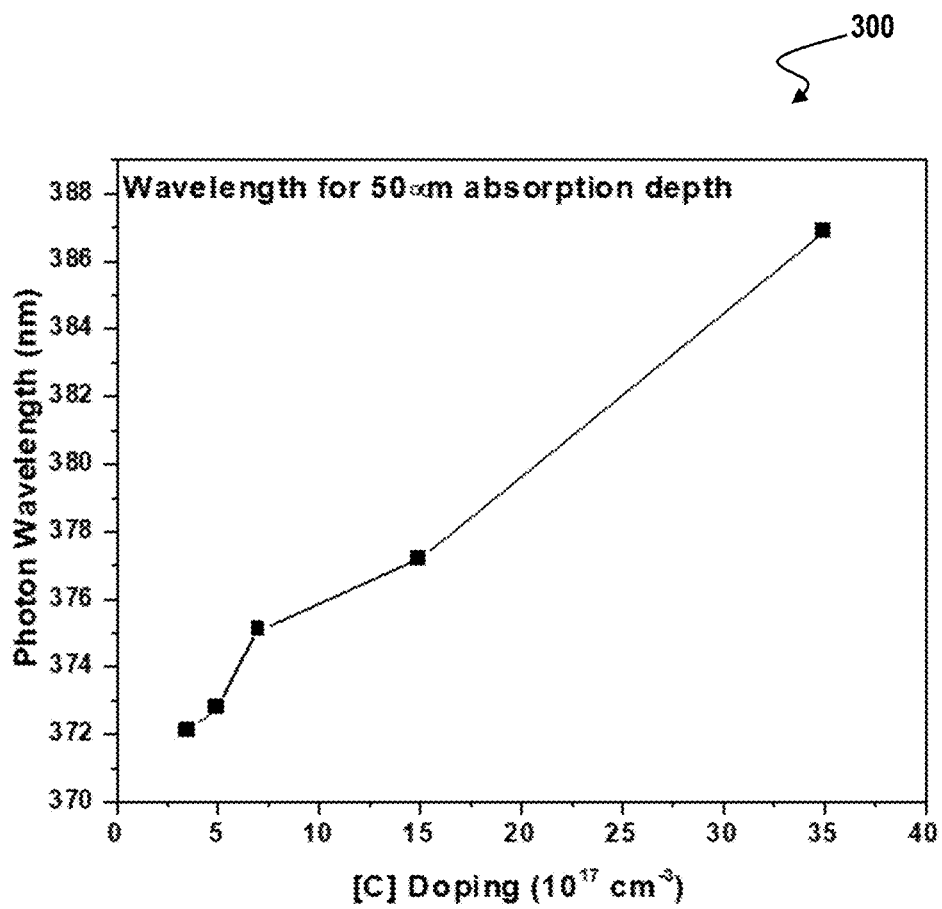
FIG. 3 is a graph illustrating illumination wavelengths required to penetrate 50 μm into a GaN semiconductor body.

FIG. 3 is a graph 300 illustrating illumination wavelengths required to penetrate 50 μm into a GaN:C semiconductor body. As shown in FIG. 3, with a light source(s) emitting light at wavelengths between 372 nanometers (nm) and 388 nm, significant photocurrent is realized at a light controlled layer (e.g., 116A), where the photoactive layer comprises GaN doped with $10^{17}$ cm$^{-3}$ carbon.

The conductivity and thus the resistance of the LCSS 200A, 200B depends strongly on the mobility of the electron and hole carriers within the semiconductor body 202A, 202B, and the concentration of free excess electron and/or hole carriers in the conduction and valance bands of the semiconductor body 202A, 202B. For above-bandgap light, the concentration of free carriers in the semiconductor body 202A, 202B depends on the band-to-band light absorption characteristics and the recombination lifetime of excess carriers in the conduction and valance bands. For sub-bandgap light, the concentration of free carriers in the semiconductor body 202A, 202B depends on the trap emission characteristics of the traps illuminated with photons with sub-bandgap photon energies (photogeneration of excess carriers from traps with energies within the bandgap) and the recombination lifetime of excess carriers in the conduction and valance bands.

Method of Use

With reference to FIG. 2A, in implementations, a power source 232 applies a voltage to the anode 204A with the cathode 206B at ground to generate an electric field through the semiconductor body 202A. A light controller(s) 234 is also connected to a power source 236 (which may be the same as power source 232), and is configured to selectively provide power to one or more light sources (e.g., 212, 212') in order to selectively activate the one or more light sources. Light impinging on the semiconductor body 202A supplies the energy (e.g., photon energy) needed to switch the LCSS 200A from a non-conductive off-state to a conductive on-state. More specifically, when the light energy is sufficient to raise electrons within the photoactive layer 216A of the semiconductor body 202A above a bandgap energy of the photoactive layer 216A, the LCSS 200A switches from a non-conductive state to an on-state wherein electrical current flows through the LCSS 200A. In implementations, the LCSS has low resistance in an on-state, as depicted by $R_{ON-SP}$ in FIG. 2A. In implementations, the voltage applied to the anode 204A with the cathode 206A at ground is more than 100 V.

With reference to FIG. 2B, in implementations, power source 232 applies a voltage to the anode 204B with the cathode 206B at ground to generate an electric field through the semiconductor body 202b. A light controller(s) 234 is also connected to a power source 236 (which may be the same as power source 232), and is configured to selectively provide power to one or more light sources (e.g., 212, 212') in order to selectively turn on the one or more light sources. Light impinging on the semiconductor body 202B supplies the energy (e.g., photon energy) needed to switch the LCSS 200B from a non-conductive off-state to a conductive on-state. More specifically, when the light energy is sufficient to raise electrons within the photoactive layer 216B of the semiconductor body 202B above a bandgap energy of the photoactive layer 216B, the LCSS 200B switches from a non-conductive state to an on-state wherein electrical current flows through the LCSS 200B. In implementations, the LCSS 200B has low resistance in an on-state, as depicted by $R_{ON-SP}$ in FIG. 2B. In general, as the electric field increases, the switch rise time decreases and the trigger energy needed to active the LCSS 200B is reduced. In implementations, the voltage applied to the anode 204B and cathode 206B is more than 100 V.

Carriers that are trapped at states within the band gap can reside in the trap after the light is turned off. In implementations, the LCSS 200A, 200B is reverse biased in an off-state to speed up the depopulation of charge that is trapped in states within the bandgap. In implementations, the semiconductor materials of LCSS 200A, 200B may be optimized to minimize persistent photoconductivity. In one embodiment, semiconductor materials with larger grain size or fewer grain boundaries are utilized, and to obtain lower levels of persistent photoconductivity within the LCSS 200A, 200B. Another approach to reduce persistent photoconductivity is to use a second subbandgap light source that can illuminate the photoactive semiconductor body from a first surface, a second surface or a third surface. A second subbandgap light source can be used to excite electrons from the valance band of the semiconductor to the energy level of extrinsic traps to reduce persistent photoconductivity. The second subbandgap light source can be a continuous light source or can be a pulsed light source. The second subbandgap light source can optically quench the persistent photoconductivity.

EXPERIMENTAL RESULTS

Experimental results show that not all forms of semi-insulating materials are suitable for LCSS layers in accordance with embodiments of the invention. More specifically, as discussed below with respect to FIGS. 4-11, GaN doped with carbon (GaN:C) was found to have advantages over other semi-insulating materials. Carbon dopants in GaN are unique in that they can form sub-bandgap states that act as a donor, acceptor, or a mid-gap deep state, depending on site occupancy and generate free excess carriers in the conduction band when illuminated with ultraviolet A (UVA) light. To date, no other extrinsic dopant in GaN has been shown to exhibit this behavior. GaN:C is unique in its ability to simultaneously block high voltages with low leakage currents, turn on efficiently with light with high photoresponsivity, and switch quickly.

In general, wide bandgap and ultra-wide bandgap semiconductor materials provide high critical electric field strength, high carrier mobility, and high carrier saturation velocity. Wide bandgap and ultra-wide bandgap semiconductor materials can have a direct bandgap or an indirect bandgap. An example of a wide bandgap material that is indirect bandgap is silicon carbide (SiC) semiconductor material.

Wide bandgap and ultra-wide bandgap semiconductors that have a direct bandgap (such as GaN, AlN, AlxGa1-xN, and gallium oxide) have advantages for use in light controlled semiconductor switch devices. For example, these materials all provide high critical electric field strength, high carrier mobility, and high saturation velocity but have the additional feature that they strongly absorb light. In addition, by being direct bandgap semiconductors, these materials can absorb light near, at, or above bandgap energies, creating a high-density of free excess carriers in the conduction band and/or valance band using only photons. In such applications, a direct bandgap semiconductor is preferable since the presence of an indirect transition limits the efficiency of free carrier generation. A direct bandgap semiconductor light-controlled switch will thus require a significantly smaller light source to generate free excess carrier.

However, not all photoactive semi-insulating materials and dopants are appropriate for the semiconductor body 202A, 202B of LCSS 200A, 200B in accordance with embodiments of the invention. Implementations of LCSS 200A, 200B: 1) block high voltage in the dark (off-state), 2) turn on with low resistance under illumination (on-state), and 3) switch between the on and off-states quickly.

Figure 4:
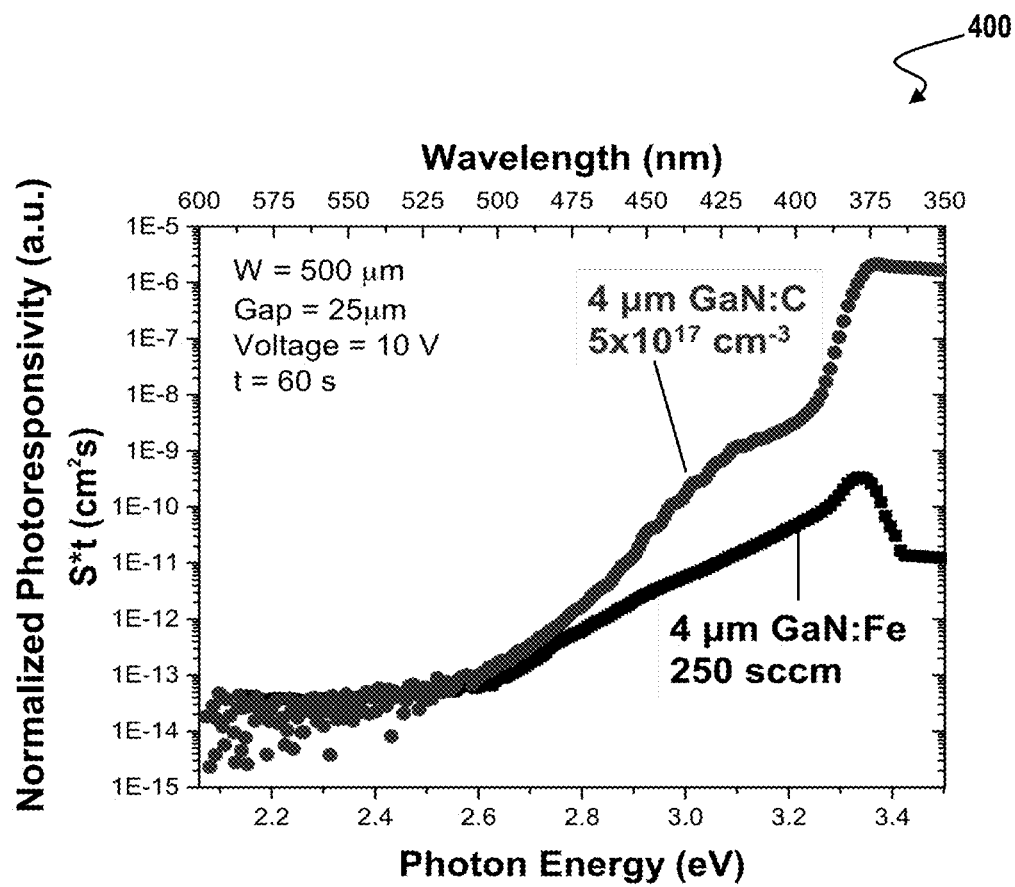
FIG. 4 is a graph illustrating a comparison of normalized photoresponsivity of GaN:C and GaN:Fe.

FIG. 4 is a graph 400 illustrating a comparison of the normalized photoresponsivity of GaN:C and GaN:Fe. Experiments were conducted with a timeframe of 60 second(s) at a voltage of 10 V, with a 25 µm gap between a light source and a 500 µm wide semiconductor material (GaN:C and GaN:Fe). As depicted in FIG. 4, experimental results showed that a metal organic chemical vapor deposition (MOCVD) generated 4 µm thick GaN layer doped with carbon (GaN:C) outperformed a 4 µm thick GaN layer doped with iron (GaN:Fe) in terms of photoresponsivity, where S is the spectral response function (proportional to photoresponsivity) and t is time. Specifically, GaN:C was shown to provide an approximately four orders of magnitude higher photoresponsivity than GaN:Fe for light wavelengths shorter than 375 nm and more than three orders-of-magnitude higher photoresponsivity than GaN doped with iron for light wavelengths shorter than 370 nm. As shown in FIG. 4, the spectral response function times (S×t) was found to be higher than $5 \times 10^{-9}$ cm$^2$ and as high as $1 \times 10^{-6}$ cm$^2$. The photoresponsivity values were found to be higher than 1 amp per watt of optical signal. Peak photoresponsitivity of GaN:C in FIG. 4 is shown at an illumination wavelength of 375 nm+/−5 nm.

Figure 5:
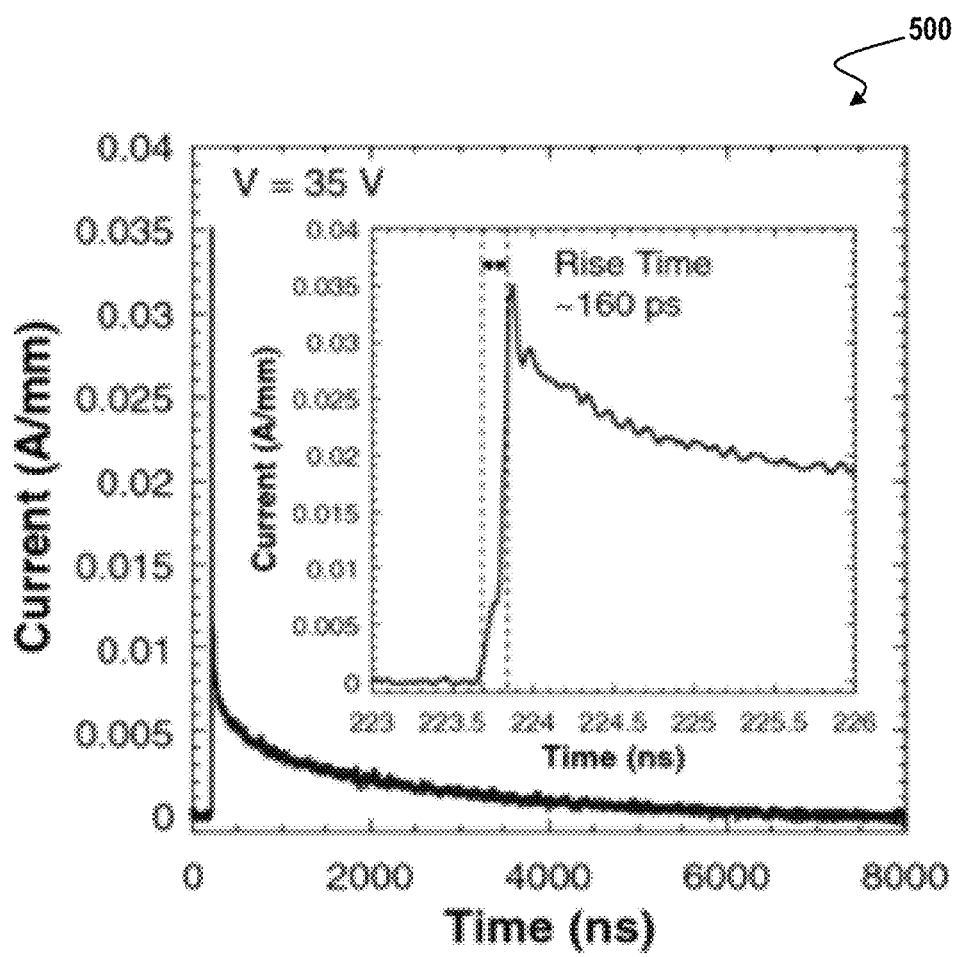
FIG. 5 is a graph illustrating a rise time of a LCSS including a photoactive layer of GaN:C, in accordance with embodiments of the invention.

FIG. 5 is a graph 500 illustrating a rise time of a LCSS including a photoactive layer of GaN:C, in accordance with embodiments of the invention. The term rise time as used herein refers to a time taken for a signal to obtain the peak response. The rise time of FIG. 5 is expressed as current (A/mm) versus time (nanoseconds). As illustrated in FIG. 5, a fast rise time of about 160 picoseconds (ps) was determined for GaN:C. It was also found that a fall time of the GaN:C substantially reduced under the application of a high applied bias to sweep out trapped charge from the traps with energies within the bandgap of the GaN:C.

Figure 6:
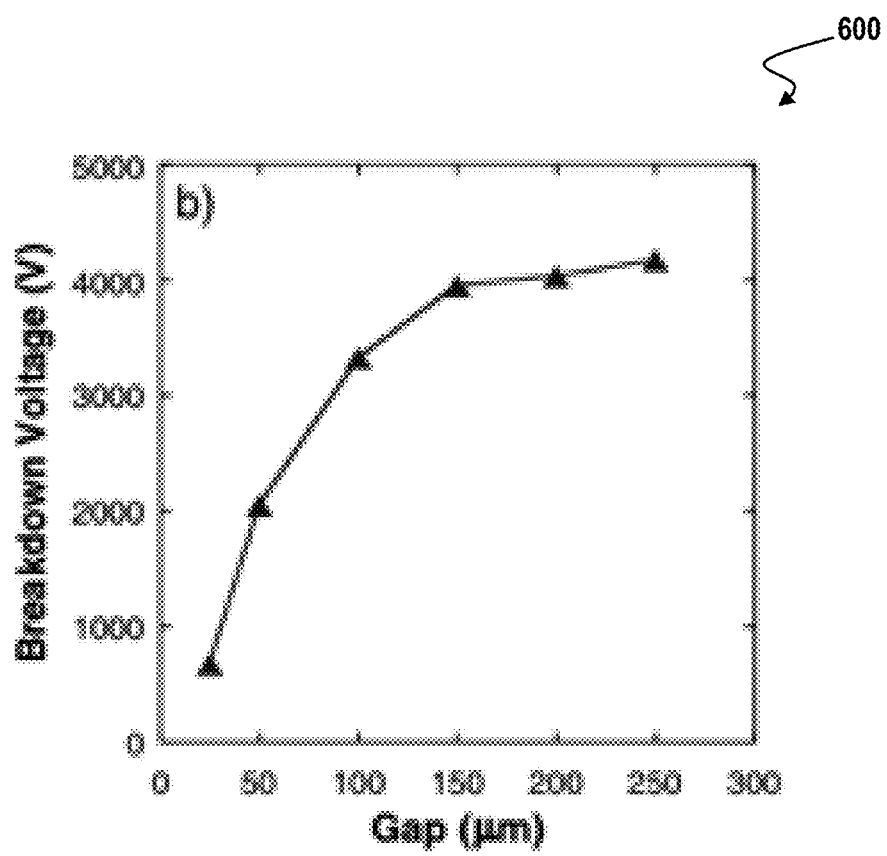
FIG. 6 is a graph illustrating breakdown voltage as a function of a gap between electrode pads for a lateral GaN:C LCSS in accordance with embodiments of the invention.

FIG. 6 is a graph 600 illustrating breakdown voltage as a function of a gap between electrode pads for a lateral GaN:C LCSS 200B in accordance with embodiments of the invention. The voltage hold-off or breakdown voltage refers to a voltage at which the leakage current from anode to cathode exceeds 1 microamps.

Figure 7:
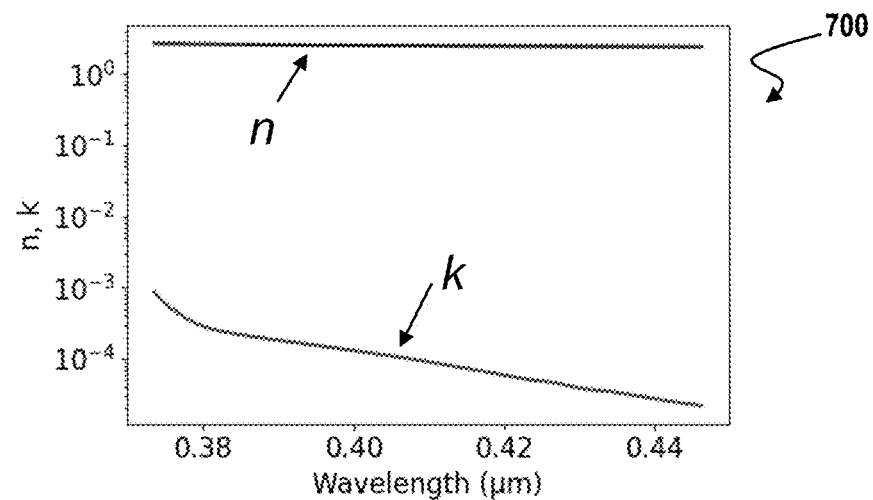
FIG. 7 is a graph illustrating an optical index of refraction for GaN doped with carbon at $7 \times 10^{17}$ cm$^{-3}$.

FIG. 7 is a graph 700 illustrating an optical index of refraction k for GaN doped with carbon at $7 \times 10^{-7}$ cm$^{-3}$. An optical index of refraction is a dimensionless number that gives an indication of the light bending ability of a medium.

As noted above, the photogeneration of excess electron carriers in a semiconductor is generally described by the following equation EQ4:

$$G = \eta_0 \frac{P\lambda}{hc} e^{-\alpha y} \qquad \text{EQ4}$$

where G is photogeneration rate, P is the (local) light intensity, η0 is the internal quantum efficiency (for excess carriers generated per photon absorbed), α is the absorption coefficient.

Figure 8:
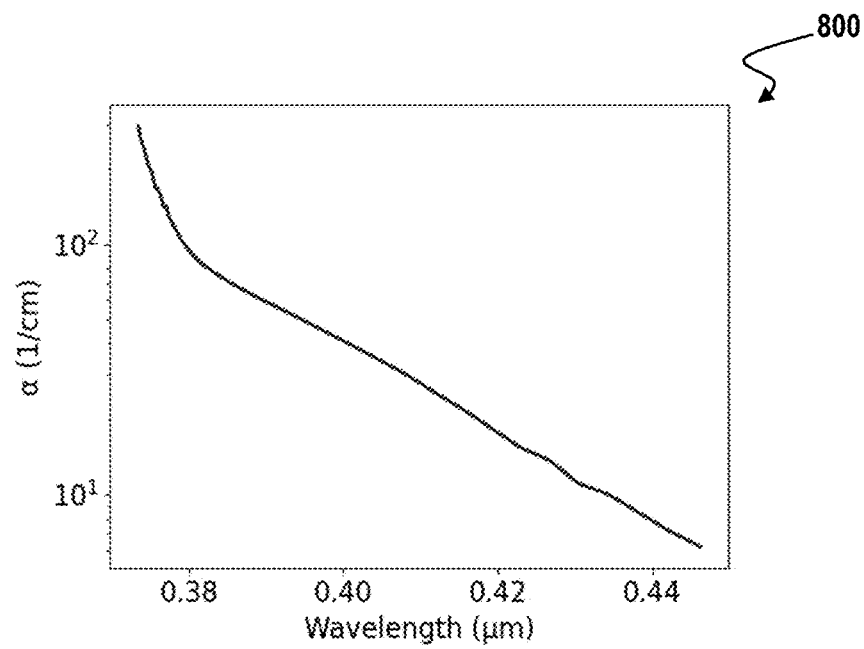
FIG. 8 is a graph illustrating an absorption coefficient of GaN:C, where C is present within a GaN layer at a concentration of $7 \times 10^{17}$ cm$^{-3}$.

The absorption coefficient, $$\alpha = \frac{4\pi}{\lambda} k,$$

corresponding to an imaginary component k of the optical index of refraction of FIG. 7 is illustrated in FIG. 8.

FIG. 8 is a graph 800 illustrating an absorption coefficient of GaN:C, where carbon is present within a GaN layer at a concentration of $7 \times 10^{17}$ cm$^{-3}$. An absorption coefficient determines how far into a material light of a particular wavelength can penetrate before it is absorbed. The inverse relation, 1/α, defines an absorption depth, which is the distance into a material at which the light drops to 1/e (or approximately 36%) of its original intensity. The absorption depth for GaN doped with $7 \times 10^{17}$ cm$^{-3}$ carbon atoms is depicted in FIG. 9.

Figure 9:
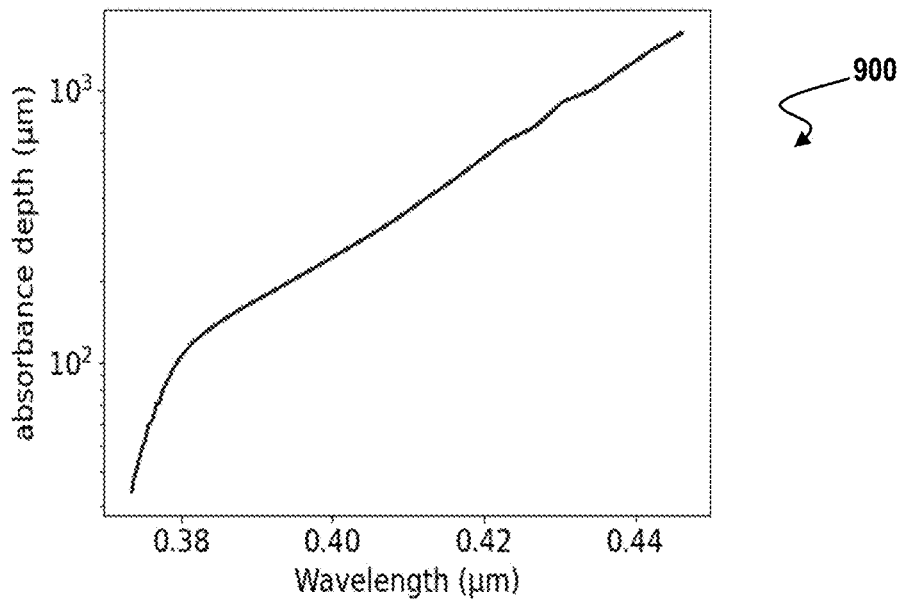
FIG. 9 is a graph illustrating the absorption depth of GaN:C, where C is present within a GaN layer at a concentration of $7 \times 10^{17}$ cm$^{-3}$.

FIG. 9 is a graph 900 illustrating the absorption depth of GaN:C, where C is present within a GaN layer at a concentration of $7 \times 10^{17}$ cm$^{-3}$. As depicted in FIG. 9, increasing a wavelength of light generally results in a greater absorbance depth.

Figure 10:
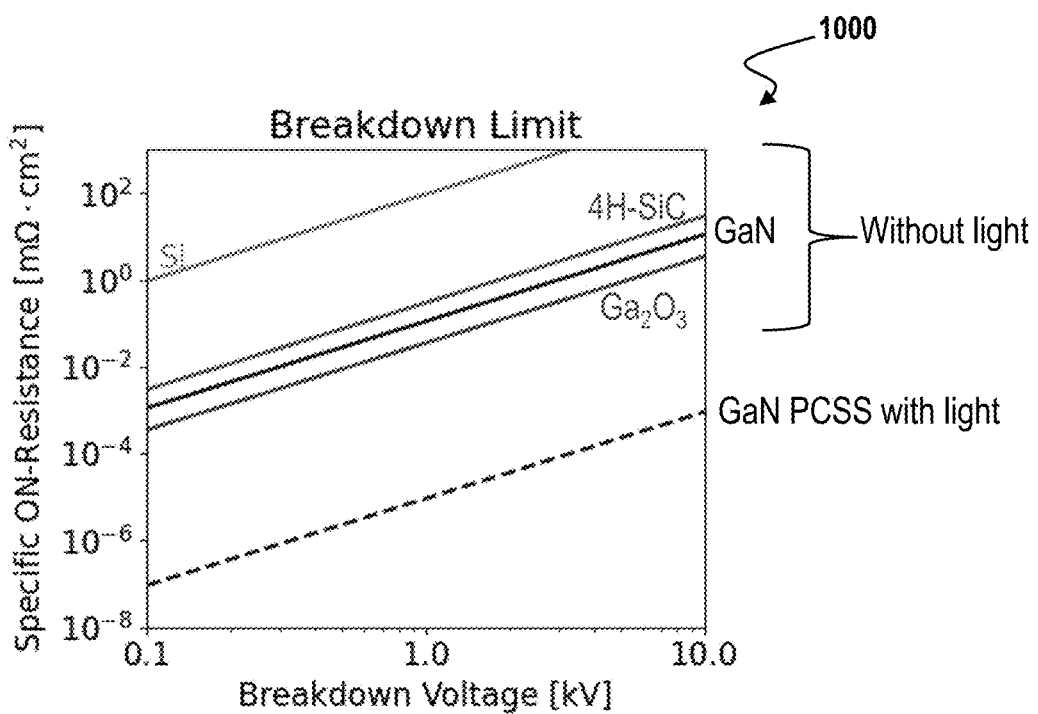
FIG. 10 is a graph illustrating a relationship between on-state resistance and breakdown voltage for GaN exposed to light from a light source compared to different semiconductor materials not exposed to light.

FIG. 10 is a graph 1000 illustrating a relationship between on-state resistance and breakdown voltage for GaN exposed to light from a light source compared to different semiconductor materials not exposed to light. Specifically, FIG. 10 illustrates on-state resistance breakdown voltage for Si, 4H—SiC, GaN and Ga$_2$O$_3$ semiconductor materials not exposed to a light source, as compared to a GaN layer wherein an external light source provides carrier generation, and thus lowers the on-state resistance (indicated by the dashed line).

Equation EQ3 above illustrates that doping of a drift layer in a LCSS does not determine the on-state resistance of the device. Instead, doping only determines maximum voltage that can be applied for a given thickness of a drift region. In FIG. 10, this impact is evident in the comparison of on-state resistance when the light controlled effect is incorporated for a GaN layer.

Figure 11:
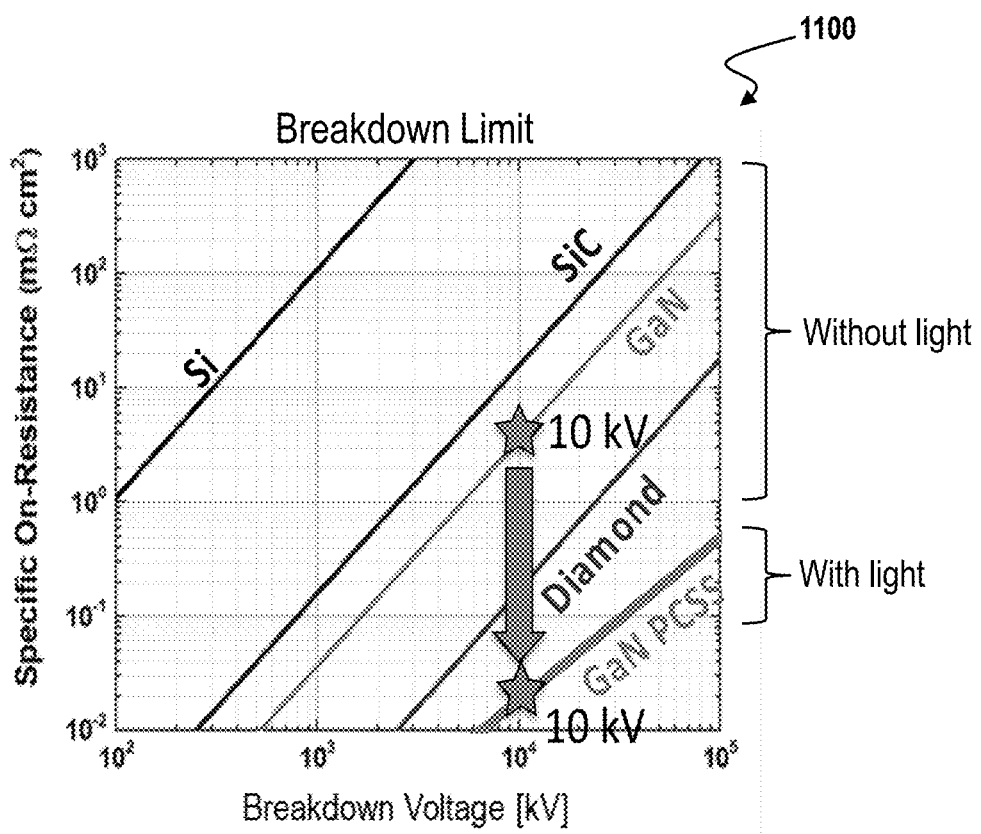
FIG. 11 is another graph illustrating a relationship between on-state resistance and breakdown voltage for GaN exposed to light from a light source compared to different semiconductor materials not exposed to light.

FIG. 11 is a graph 1100 illustrating a relationship between on-state resistance and breakdown voltage for GaN exposed to light from a light source compared to different semiconductor materials not exposed to light. Specifically, FIG. 11 illustrates on-state resistance breakdown voltage for Si, SiC, GaN and diamond semiconductor materials not exposed to a light source compared to a GaN layer wherein an external light source provides carrier generation, and thus lowers the on-state resistance (GaN LCSS). As indicated in FIG. 11, there is a significant difference between the on-state resistance for GaN without light exposure and on-state resistance for GaN with light exposure at a breakdown voltage of 10 kV.

Figure 12:
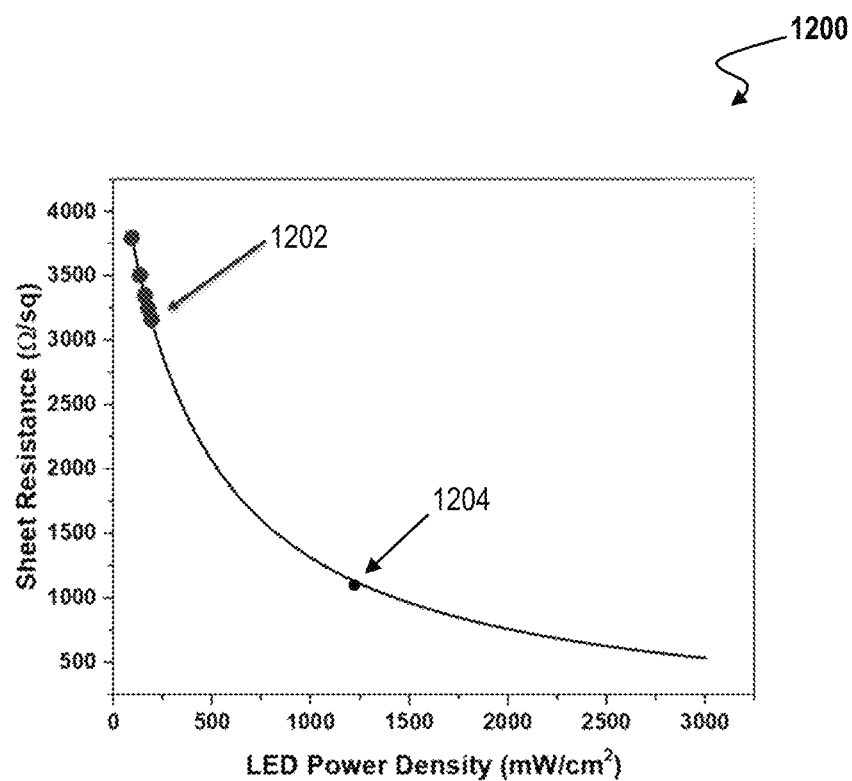
FIG. 12 is a graph illustrating sheet resistance of a lateral GaN:C LCSS in accordance with embodiments of the invention with varied illumination

FIG. 12 is a graph 1200 illustrating sheet resistance of a lateral GaN:C LCSS 200B in accordance with embodiments of the invention with varied illumination. Sheet resistance at a lower power LED is illustrated at 1202, and sheet resistance at a higher power LED producing over 1000 mW/cm$^2$ is shown at 1204.

Figure 13:
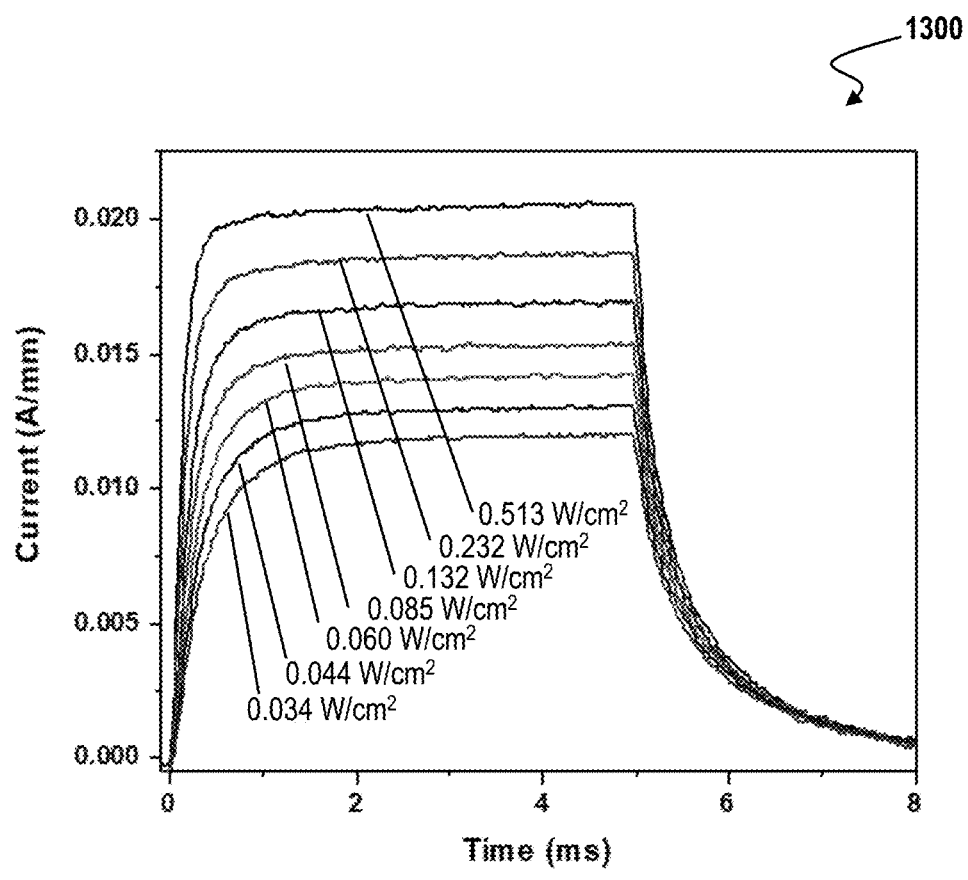
FIG. 13 is a graph depicting a light pulse response characteristic of an LCSS in accordance with embodiments of the invention.

FIG. 13 is a graph 1300 depicting a light pulse response characteristic of an LCSS in accordance with embodiments of the invention. More specifically, graph 1300 shows current over time for a GaN:C LCSS exposed to different levels of illumination power in accordance with embodiments of the invention. Specifically, FIG. 13 depicts current increasing in an LCSS of the present invention as the LCSS is exposed to increasing amounts of illumination in watts per centimeter squared (W/cm$^2$).

Figure 14:
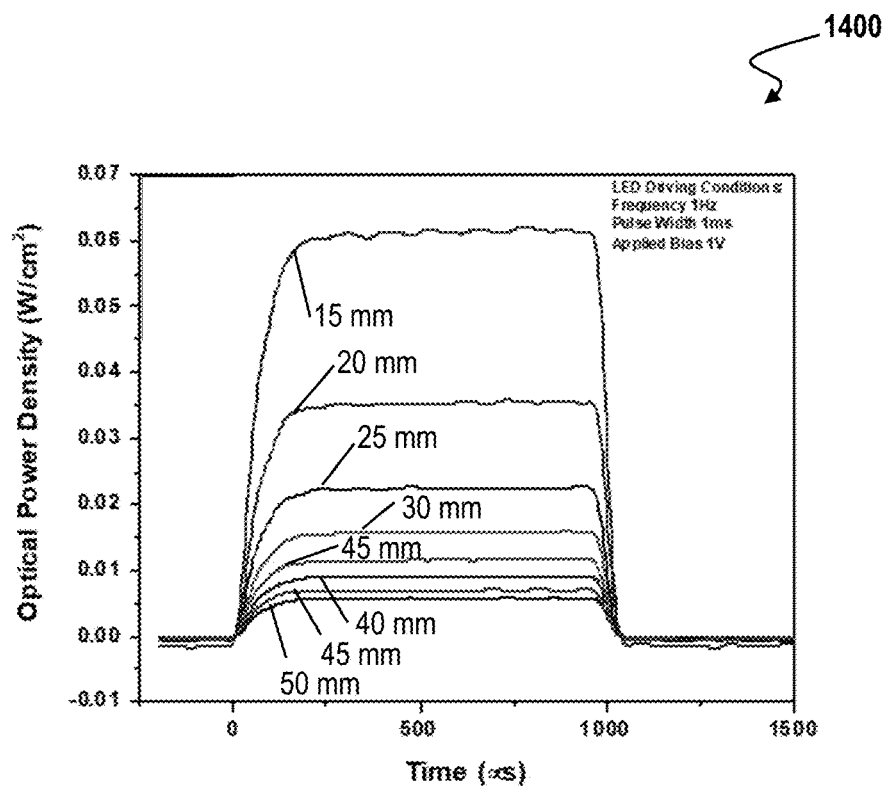
FIG. 14 is a graph depicts a light pulse response characteristic of an LCSS in accordance with embodiments of the invention.

FIG. 14 is a graph 1400 depicts a light pulse response characteristic of an LCSS in accordance with embodiments of the invention. More specifically, FIG. 14 depicts the optical response for different separation distances between an LED light source and a first surface (top surface) of the LCSS with a separation in the range of 15 mm to 50 mm.

Figure 15:
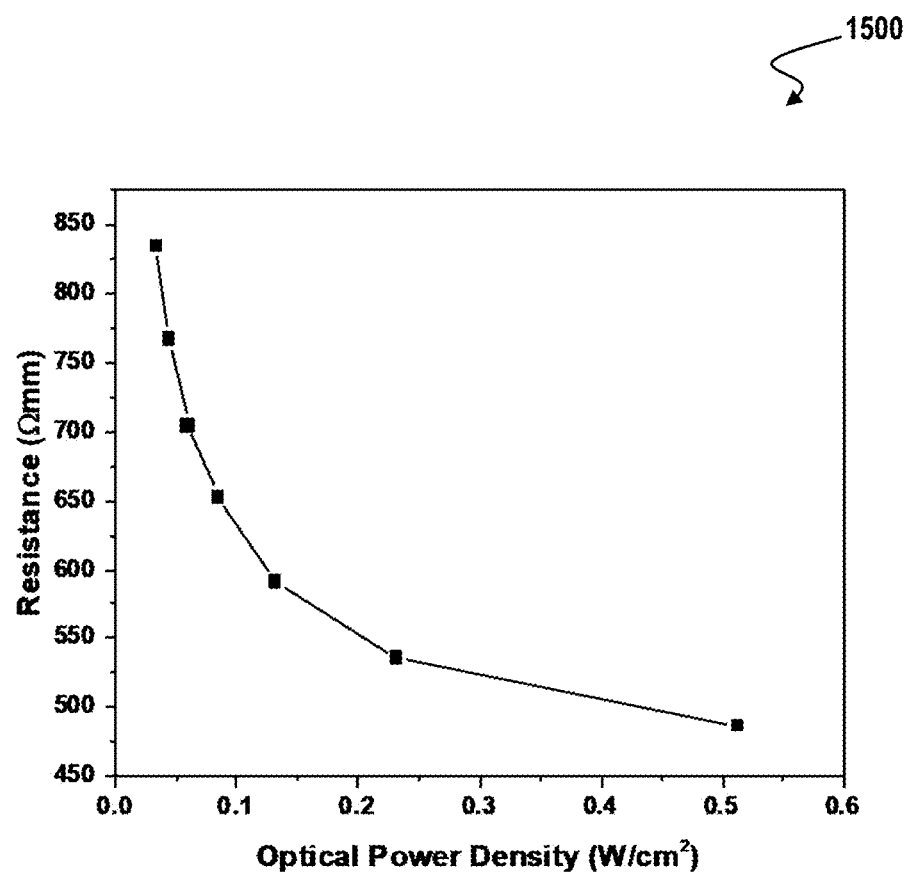
FIG. 15 is a graph depicting specific lateral resistance in a GaN:C LCSS in accordance with embodiments of the invention with changes in optical power density (W/cm$^2$).

FIG. 15 is a graph 1500 depicting specific lateral resistance in a GaN:C LCSS in accordance with embodiments of the invention with changes in optical power density (W/cm$^2$).

Implementations of the invention provide a LCSS 200A, 200B that can 1) block high voltage in the dark (off-state); 2) turn on with low resistance under illumination (on-state); and 3) switch between the on and off-state quickly. Advantageously, a LCSS 200A, 200B according to embodiments of the invention can overcome the on-resistance vs. breakdown voltage limits of the drift layer (photoactive layer 216A, 216B) by injecting a high density of free carriers with light, while facilitating fast switching speeds and inherently providing optical isolation to gate driver control circuitry of the controller. In implementations, the high photoresponsivity of a GaN:C photoactive layer 216A, 216B provides a specific resistivity less than 20 mohm-cm$^2$ resistivity at 10 kV blocking voltage using an ultraviolet A (UVA) light source.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical light controlled semiconductor switch (LCSS) comprising:
   a semiconductor body including a photoactive layer of gallium nitride (GaN) doped with carbon;
   a first electrode in contact with a first surface of the semiconductor body, the first electrode defining an area through which light energy from at least one light source can impinge on the first surface; and
   a second electrode in contact with a second surface of the semiconductor body opposed to the first surface, wherein the LCSS is configured to switch from a non-conductive off-state to a conductive on-state when the light energy impinging on the semiconductor body is sufficient to raise electrons within the photoactive layer into a conduction band of the photoactive layer.

2. The vertical LCSS of claim 1, wherein the semiconductor body includes a substrate selected from the group consisting of GaN, gallium oxide and silicon carbide (SiC).

3. The vertical LCSS of claim 1, wherein the LCSS has a specific resistance in the on-state of less than 20 mohm-centimeters squared (mΩ-cm$^2$).

4. The vertical LCSS of claim 1, wherein the LCSS has a blocking voltage more than 100 V in the off-state.

5. The vertical LCSS of claim 1, wherein the area comprises at least a portion of the first electrode, and the first electrode is transparent to the light energy.

6. The vertical LCSS of claim 1, wherein the area comprises an opening defined by the first electrode through which the light energy can pass.

7. The vertical LCSS of claim 1, wherein the semiconductor body is configured such that a third surface of the semiconductor body is exposed to light from the at least one light source or one or more other light sources.

8. The vertical LCSS of claim 1, wherein the carbon is present within the photoactive layer at a dopant concentration of less than $10^{18}$ per cubic centimeter (cm$^{-3}$).

9. The vertical LCSS of claim 1, wherein the photoactive layer has a thickness of less than 100 microns (μm) throughout which free excess electron carriers are generated in the on-state.

10. A method of using a vertical light controlled semiconductor switch (LCSS) including a semiconductor body having a photoactive layer of gallium nitride (GaN) doped with carbon and a substrate layer, a first electrode in contact with a first surface of the semiconductor body, and a second electrode in contact with a second surface of the semiconductor body opposed to the first surface, the method comprising:
    applying a voltage to the first and second electrodes to generate an electric field within the semiconductor body; and
    applying light energy from a light source to at least the first surface of the semiconductor body, wherein the light energy is sufficient to raise electrons within the photoactive layer above a bandgap energy of the photoactive layer, thereby switching the vertical LCSS from a non-conductive off-state to a conductive on-state.

11. The method of claim 10, wherein the substrate layer is selected from the group consisting of: GaN, gallium oxide, and silicon carbide (SiC).

12. The method of claim 10, wherein the vertical LCSS has a specific resistance in the on-state of less than 20 mohm-centimeters squared (mΩ-cm$^2$).

13. The method of claim 10, wherein the vertical LCSS has a blocking voltage of more than 100 V in the off-state.

14. The method of claim 10, wherein the first electrode is transparent to the light energy.

15. The method of claim 10, wherein the first electrode defines an opening through which the light energy impinges on the first surface of the semiconductor body.

16. The method of claim 10, wherein applying the light energy comprises applying the light energy from at least one additional light source to a third surface of the semiconductor body.

17. The method of claim 10, wherein the carbon is present within the photoactive layer at a dopant concentration in a range of $10^{17}$ per cubic centimeter ($cm^{-3}$) to $10^{18}$ per cubic centimeter ($cm^{-3}$).

18. The method of claim 10, wherein the photoactive layer has a thickness of 50 microns (μm).

19. A method of making a vertical light controlled semiconductor switch (LCSS) comprising:
   depositing a photoactive layer of gallium nitride (GaN) doped with carbon on a crystalline substrate to form a semiconductor body;
   depositing a first electrode in contact with a first surface of the semiconductor body, the first electrode defining an area through which light energy from at least one light source can impinge on the first surface; and
   depositing a second electrode in contact with a second surface of the crystalline substrate opposed to the first surface, wherein the vertical LCSS is configured to switch from a non-conductive off-state to a conductive on-state when light energy impinging on the semiconductor body is sufficient to raise electrons within the photoactive layer above a bandgap energy of the photoactive layer.

20. The method of claim 19, wherein depositing the photoactive layer of GaN doped with carbon on the crystalline substrate to form the semiconductor body comprises a metal-organic chemical vapor deposition (MOCVD) of GaN doped with carbon on the crystalline substrate selected from the group consisting of: silicon carbide (SiC), gallium oxide, and GaN.

* * * * *